(12) United States Patent
Wang et al.

(10) Patent No.: US 11,342,311 B2
(45) Date of Patent: May 24, 2022

(54) LED-FILAMENTS AND LED-FILAMENT LAMPS UTILIZING MANGANESE-ACTIVATED FLUORIDE RED PHOTOLUMINESCENCE MATERIAL

(71) Applicant: Intematix Corporation, Fremont, CA (US)

(72) Inventors: Gang Wang, Sunnyvale, CA (US); Jun-Gang Zhao, Fremont, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 16/540,019

(22) Filed: Aug. 13, 2019

(65) Prior Publication Data

US 2020/0303354 A1 Sep. 24, 2020

Related U.S. Application Data

(60) Provisional application No. 62/831,699, filed on Apr. 9, 2019, provisional application No. 62/820,249, filed on Mar. 18, 2019.

(51) Int. Cl.
*H01L 33/50* (2010.01)
*H01L 25/075* (2006.01)
(Continued)

(52) U.S. Cl.
CPC ........ *H01L 25/0753* (2013.01); *H01L 33/504* (2013.01); *H01L 33/507* (2013.01);
(Continued)

(58) Field of Classification Search
CPC ... H01L 33/504; H01L 33/502; H01L 33/507; H01L 25/0753; H01L 33/501;
(Continued)

(56) References Cited

U.S. PATENT DOCUMENTS 8,529,791 B2 9/2013 Wu et al.
8,597,545 B1 12/2013 Liu et al.
(Continued)

FOREIGN PATENT DOCUMENTS

CN 1719633 A 1/2006
CN 1818012 A 8/2006
(Continued)

OTHER PUBLICATIONS

U.S. Appl. No. 15/282,551, filed May 25, 2017, Zhu et al.
(Continued)

*Primary Examiner* — David Chen
(74) *Attorney, Agent, or Firm* — CrossPond Law

(57) ABSTRACT

An LED-filament comprising: a partially light-transmissive substrate; a plurality of blue LED chips mounted on a front face of the substrate; first broad-band green to red photoluminescence materials and a first narrow-band manganese-activated fluoride red photoluminescence material covering the plurality of blue LED chips and the front face of the substrate; and second broad-band green to red photoluminescence materials covering the back face of the substrate. The LED-filament can further comprise a second narrow-band manganese-activated fluoride red photoluminescence material on the back face of the substrate in an amount that is less than 5 wt % of a total red photoluminescence material content on the back face of the substrate.

12 Claims, 10 Drawing Sheets

SECTION C-C

(51) Int. Cl.
*F21Y 103/10* (2016.01)
*F21K 9/232* (2016.01)
*F21Y 115/10* (2016.01)

(52) U.S. Cl.
CPC ........... *F21K 9/232* (2016.08); *F21Y 2103/10* (2016.08); *F21Y 2115/10* (2016.08); *H01L 2933/0091* (2013.01)

(58) Field of Classification Search
CPC ........... H01L 33/508; H01L 2933/0041; H01L 2933/0091
USPC ................................. 257/88, 98, 99, 33.068
See application file for complete search history.

(56) References Cited

U.S. PATENT DOCUMENTS

| | | | |
|---|---|---|---|
| 8,663,502 B2 | 3/2014 | Tao | |
| 8,890,403 B2 | 11/2014 | Sakuta et al. | |
| 8,957,585 B2 | 2/2015 | Li et al. | |
| 9,261,242 B2* | 2/2016 | Ge | F21V 19/005 |
| 9,752,734 B2 | 9/2017 | Tanda et al. | |
| 9,967,943 B1 | 5/2018 | Wang et al. | |
| 10,026,874 B1 | 7/2018 | Li et al. | |
| 10,468,564 B1 | 11/2019 | Zhao et al. | |
| 10,495,263 B2 | 12/2019 | Chowdhury et al. | |
| 10,535,805 B2 | 1/2020 | Li et al. | |
| 10,568,172 B2 | 2/2020 | Li et al. | |
| 2004/0124758 A1 | 7/2004 | Danielson et al. | |
| 2007/0108888 A1 | 5/2007 | Chen et al. | |
| 2007/0125984 A1 | 6/2007 | Tian et al. | |
| 2007/0139949 A1* | 6/2007 | Tanda | F21V 13/14 362/551 |
| 2010/0013373 A1 | 1/2010 | Hata et al. | |
| 2010/0142189 A1 | 6/2010 | Hong et al. | |
| 2010/0163892 A1* | 7/2010 | Liu | F21V 31/04 257/89 |
| 2010/0289044 A1 | 11/2010 | Krames et al. | |
| 2011/0068354 A1 | 3/2011 | Tran et al. | |
| 2011/0227469 A1 | 9/2011 | Yuan et al. | |
| 2012/0032219 A1 | 2/2012 | Ooyabu et al. | |
| 2012/0217862 A1 | 8/2012 | Matsuda et al. | |
| 2012/0275157 A1* | 11/2012 | Hsu | F21S 4/22 362/249.14 |
| 2012/0306340 A1 | 12/2012 | Hoetzl et al. | |
| 2013/0069089 A1 | 3/2013 | Hussell et al. | |
| 2013/0320363 A1* | 12/2013 | Pan | H01L 33/62 257/88 |
| 2014/0103373 A1 | 4/2014 | Li et al. | |
| 2014/0167601 A1 | 6/2014 | Harry et al. | |
| 2014/0231857 A1 | 8/2014 | Nammalwar et al. | |
| 2014/0353704 A1 | 12/2014 | Kamikawa | |
| 2015/0035430 A1 | 2/2015 | Yoshida et al. | |
| 2015/0069442 A1 | 3/2015 | Liu et al. | |
| 2015/0329770 A1 | 11/2015 | Kaneyoshi et al. | |
| 2015/0357528 A1 | 12/2015 | Tsumori et al. | |
| 2015/0364659 A1 | 12/2015 | Setlur et al. | |
| 2016/0097495 A1 | 4/2016 | Yamamoto et al. | |
| 2016/0116124 A1 | 4/2016 | Podowitz et al. | |
| 2016/0161067 A1 | 6/2016 | Oepts et al. | |
| 2016/0202555 A1 | 7/2016 | Tanaka | |
| 2016/0233387 A1* | 8/2016 | Kitano | C09K 11/617 |
| 2016/0233393 A1 | 8/2016 | Okuno et al. | |
| 2016/0254416 A1 | 9/2016 | Cheng | |
| 2016/0351757 A1 | 12/2016 | Yoshimura et al. | |
| 2016/0372638 A1 | 12/2016 | Todorov et al. | |
| 2017/0125650 A1 | 5/2017 | Pickett et al. | |
| 2017/0145310 A1 | 5/2017 | Li et al. | |
| 2017/0283695 A1 | 10/2017 | Yoshida et al. | |
| 2018/0040786 A1 | 2/2018 | Chen | |
| 2018/0204984 A1 | 7/2018 | Li et al. | |
| 2018/0212128 A1 | 7/2018 | Hayashi | |
| 2018/0226549 A1 | 8/2018 | Nakabayashi et al. | |
| 2018/0287019 A1 | 10/2018 | Hashimoto et al. | |
| 2018/0315899 A1 | 11/2018 | Li et al. | |
| 2018/0328543 A1 | 11/2018 | Bergmann et al. | |
| 2019/0139943 A1 | 5/2019 | Tiwari et al. | |
| 2019/0194537 A1 | 6/2019 | Sekiguchi et al. | |
| 2019/0198719 A1 | 6/2019 | Fujioka et al. | |
| 2019/0198722 A1 | 6/2019 | Nakabayashi et al. | |
| 2020/0056747 A1 | 2/2020 | Jiang et al. | |
| 2020/0058835 A1 | 2/2020 | Rintamaki et al. | |
| 2020/0066949 A1 | 2/2020 | Jiang et al. | |
| 2020/0088355 A1 | 3/2020 | Dutta et al. | |
| 2020/0176646 A1 | 6/2020 | Li et al. | |
| 2020/0287102 A1* | 9/2020 | Bertram | C09K 11/08 |

FOREIGN PATENT DOCUMENTS

| | | |
|---|---|---|
| CN | 103547858 A | 1/2014 |
| CN | 102439682 B | 3/2016 |
| CN | 103717701 B | 8/2016 |
| CN | 207350041 U | 5/2018 |
| CN | 207906894 U | 9/2018 |
| CN | 208871526 U | 5/2019 |
| CN | 209196573 U | 8/2019 |
| CN | 110234926 A | 9/2019 |
| CN | 110388612 A | 10/2019 |
| CN | 209558063 U | 10/2019 |
| DE | 102016105211 A1 | 9/2017 |
| EP | 2747157 B1 | 3/2016 |
| EP | 3226313 A1 | 10/2017 |
| EP | 3279952 A1 | 2/2018 |
| EP | 3568630 A1 | 11/2019 |
| EP | 2629341 | 4/2020 |
| KR | 101683270 B1 | 12/2016 |
| WO | 2010053341 A1 | 5/2010 |
| WO | 2011138707 A1 | 11/2011 |
| WO | 2017044380 A1 | 3/2017 |
| WO | 2017062314 A1 | 4/2017 |
| WO | 2018132778 A1 | 7/2018 |
| WO | 2019005597 A1 | 1/2019 |
| WO | 2019118959 A1 | 6/2019 |
| WO | 2020015420 A1 | 1/2020 |
| WO | PCTUS2023095 | 3/2020 |

OTHER PUBLICATIONS

U.S. Appl. No. 16/669,449, filed Oct. 30, 2019, Gang Wang.
European Search Opinion, dated Jul. 2020, EP18738546.
International Search Report.
International Search Report, PCT/US2020/023095.
International Search Report, PCT/US2020/023110.
International Search Report, PCT/US2020/023187.
IPRP, Jul. 2020; PCT/US18/65952.
Office Action dated Mar. 18, 2020; CN app. No. 201880007010.4.
Supplementary European Search Report, dated Jul. 2020, EP18738546.
Written Opinion of the International Search Authority.
Written Opinion of the International Search Authority, PCT/US2020/023095.
Written Opinion of the International Search Authority, PCT/US2020/023187.
Written Opinion of the ISA.
Written Opinion of the ISA, PCT/US2020/023110.

* cited by examiner

SECTION A - A

SECTION B-B

SECTION C-C

LED-FILAMENTS AND LED-FILAMENT LAMPS UTILIZING MANGANESE-ACTIVATED FLUORIDE RED PHOTOLUMINESCENCE MATERIAL

CROSS REFERENCE TO RELATED APPLICATIONS

This application claims the benefit of priority to U.S. Provisional application No. 62/831,699, filed Apr. 9, 2019, entitled "LED-FILAMENTS AND LED-FILAMENT LAMPS", which is hereby incorporated by reference in its entirety.

FIELD OF THE INVENTION

Embodiments of the present invention are directed to LED-filaments and LED-filament lamps. More particularly, although not exclusively, the invention concerns LED-filaments and LED-filament lamps that generate light having a General Color Rendering Index CRI Ra of at least 80.

BACKGROUND OF THE INVENTION

White light emitting LEDs ("white LEDs") include one or more photoluminescence materials (typically inorganic phosphor materials), which absorb a portion of the blue light emitted by the LED and re-emit light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high luminous efficacy (100 lm/W and higher), white LEDs are rapidly being used to replace conventional fluorescent, compact fluorescent and incandescent lamps.

Recently, LED-filament lamps have been developed comprising LED-filaments whose visual appearance resemble the filament of a traditional incandescent lamp. The LED-filaments, which are typically 2 inches (52 mm) long, comprise COG (Chip-On-Glass) devices having a plurality of low-power LED chips mounted on one face of a light-transmissive glass substrate. Front and back faces of the light-transmissive substrate are coated with a phosphor-impregnated encapsulant, such as silicone. Typically, the phosphor comprises a mixture of green and red light emitting phosphors for generating warm white light and to increase General Color Rendering Index (CRI Ra) of light generated by the filament. The same phosphor-impregnated encapsulant is applied to both faces of the substrate to ensure that the filament generates the same color of light in forward and backward directions.

Narrow-band red phosphors such as, for example, manganese-activated fluoride phosphors such as $K_2SiF_6:Mn^{4+}$ (KSF), $K_2TiF_6:Mn^{4+}$ (KTF), and $K_2GeF_6:Mn^{4+}$ (KGF) have a very narrow red spectrum (Full Width Half Maximum of less than 10 nm for their main emission line spectrum) which makes them highly desirable for attaining high brightness (about 25% brighter than broad-band red phosphors such as europium-activated red nitride phosphor materials such as CASN—$CaAlSiN_3:Eu$) and high CRI Ra in general lighting applications. While manganese-activated fluoride photoluminescence materials are highly desirable, there are drawbacks that make their use in LED-filaments challenging. For example, the absorption capability of manganese-activated fluoride phosphors is substantially lower (typically about a tenth) than that of europium-activated red nitride phosphor materials are currently used in LED-filaments. Therefore, in order to achieve the same target color point, the usage amount of manganese-activated fluoride phosphors typically can be from 5 to 20 times greater than the usage amount of a corresponding europium-activated red nitride phosphor. The increased amount of phosphor usage significantly increases the cost of manufacture since manganese-activated fluoride phosphors are significantly more expensive than europium-activated red nitride phosphors (at least five times more expensive). Moreover, compared with packaged LEDs, since equal amounts of phosphor are required on each side of the filament, this doubles usage amount of manganese-activated fluoride photoluminescence material. As a result of the higher usage and higher cost, use of narrow-band manganese-activated fluoride red phosphors is prohibitively expensive for LED-filaments.

Embodiments of the invention concern improvements relating to the LED-filaments and LED-filament lamps and in particular, although not exclusively, reducing the cost of manufacture of LED-filaments without compromising on brightness and CRI Ra through innovative phosphor packaging structures to improve the blue absorption efficiency of manganese-activated fluoride photoluminescence material.

SUMMARY OF THE INVENTION

Some embodiments of the invention concern LED-filaments that are configured to generate a majority (e.g. at least 70% of the total) of light in a forward direction away from a front face of the substrate on which the LED chips are mounted and a small proportion of light in a backward direction away from the back face of the substrate. More particularly, the substrate and LED chips are configured such that the proportion of total blue excitation light generated by the blue LED chips on (emanates from) the front face side of the substrate is substantially greater (e.g. at least 70% of the total) than on (emanates from) the opposite back face side. Such a configuration enables use of a higher brightness narrow-band red phosphor on the front face of the substrate only and a less expensive red phosphor other than a manganese-activated fluoride phosphor ("non-manganese-activated fluoride photoluminescence material" also referred to as a broad-band red photoluminescence material) on the back face of the substrate while still providing substantially most of the superior brightness benefit of using narrow-band manganese activated fluoride on both faces, but using only half (50% by weight) the quantity of narrow-band red photoluminescence material. This is to be contrasted with known LED-filaments which use the same photoluminescence materials on the front and back faces of the substrate to ensure a uniform color emission in forward and backward directions. In accordance with the invention, the LED-filament can be configured in the above way by, for example, using: (i) a partially light-transmissive substrate, (ii) LED chips that generate more light from a top face in a forward/upward direction than in a backward/downward direction from a bottom face (base) towards the substrate, (iii) providing a reflector, or partial reflector, on the base of one or more of the LED chips or a combination thereof. The present invention finds particular utility in LED-filaments that use an at least partially light-transmissive substrate.

In some embodiments, an LED-filament comprises a partially light-transmissive substrate having a plurality of blue LED chips mounted on a front face of the substrate; narrow-band red and first broad-band green to red photoluminescence materials disposed on and covering the front face of the substrate and the plurality of blue LED chips; and second broad-band green to red photoluminescence materials covering the opposite back face of the substrate, there being only a small quantity or no narrow-band photoluminescence material present on the back face. The narrow-band and broad-band red photoluminescence materials typically have different crystal structures—that is the red photoluminescence material covering the front face has a different crystal structure to that of the red photoluminescence material covering the back face. In an embodiment, the narrow-band red photoluminescence material comprises a manganese-activated fluoride photoluminescence material (e.g. KSF), and the broad-band red photoluminescence material comprises rare-earth activated red photoluminescence material, for example, CASN. In this patent specification "broad-band red photoluminescence material" and "non manganese-activated fluoride photoluminescence material" denotes a red photoluminescence material whose crystal structure is other than that of a manganese-activated fluoride red photoluminescence material, such as for example rare-earth-activated red photoluminescence materials including for example a red emitting nitride-based phosphor, a Group IIA/IIB selenide sulfide or silicate-based photoluminescence (phosphor) material.

According to an embodiment, an LED-filament comprises: a partially light-transmissive substrate; a plurality of blue LED chips mounted on a front face of the substrate; first broad-band green to red photoluminescence materials and a first narrow-band manganese-activated fluoride red photoluminescence material covering the plurality of blue LED chips and the front face of the substrate; and second broad-band green to red photoluminescence materials covering the back face of the substrate. The inventors have discovered that by providing the narrow-band manganese-activated fluoride red photoluminescence on only the front face of the substrate and a less expensive second broad-band photoluminescence material on the back face of the substrate provides substantially the same brightness increase benefit but uses only half (50% by weight) the quantity of manganese-activated fluoride photoluminescence material. In embodiments, the LED-filament can further comprises a second narrow-band manganese-activated fluoride red photoluminescence material on the back face of the substrate in an amount that is less than 5 wt % of a total red photoluminescence material content on the back face of the substrate. Embodiments of the invention comprise 0 wt % of the second narrow-band manganese-activated fluoride red photoluminescence material on the back face of the substrate.

In embodiments, the substrate has a transmittance of at least one of: 2% to 70%, 30% to 50% and 10% to 30%. In embodiments, at least one of: at least 70%, at least 80%, and at least 90% of the total blue light generated by the LED chips is on the front face side of the substrate. Since, in embodiments of the invention, the substrate is only partially light-transmissive and/or the LED chips have a reflector covering their base, a greater proportion of the total blue excitation light generated by the blue LED chips will be on (emanates from) the front face side of the substrate than on the back face side of the substrate. It will be appreciated that this is true even when the LED chips generate equal amounts of blue excitation light in forward (i.e. away from the front face of the substrate) and backward (i.e. towards the front face substrate) directions since the substrate will allow passage of only a proportion of blue excitation light to pass and reflect the remainder resulting in greater proportion of blue excitation light on the front face side of the substrate. Due to this difference in the proportion of total blue excitation light on opposite faces of the substrate, it enables use of a less expensive broad-band red photoluminescence material (e.g. CASN) on a back face of the substrate, thereby substantially reducing costs while increasing brightness.

The LED-filament can comprise a single-layer structure comprising a layer comprising a mixture of the narrow-band red photoluminescence material and the first broad-band green to red photoluminescence materials. To further reduce narrow-band red photoluminescence material usage, the layer can further comprise particles of a light scattering material such as for example particles of zinc oxide; silicon dioxide; titanium dioxide; magnesium oxide; barium sulfate; aluminum oxide and combinations thereof. A single-layer structure may be more robust and also enhance ease of manufacture due the different photoluminescence materials being comprised in the same layer. This may reduce cost and time of manufacture, and also help eradicate errors during manufacture since there are less steps involved in the creation of the single-layer structure.

Alternatively, in order to further improve the blue absorption efficiency of the narrow-band red photoluminescence material, the LED-filament can comprise a double-layer structure in which the narrow-band red photoluminescence material is located in a separate layer from the broad-band green to red photoluminescence materials with the separate layer being disposed on top of the LED chips in, for example, the form of a conformal coating. In such embodiments, an LED-filament can comprise a first layer comprising the first narrow-band red photoluminescence material disposed on the plurality of blue LED chips, and a second layer comprising the first broad-band green to red photoluminescence material disposed on the first layer. In embodiments, the first layer can comprise a uniform thickness layer (film) on at least the principle light emitting face of at least one of the LED chips, that is the LED-filament comprises CSP (Chip Scale Packaged) LEDs containing the narrow-band red photoluminescence material. The first layer can comprise a uniform thickness layer on all light emitting faces of the LED chips in the form of a conformal coating layer. To further reduce narrow-band red photoluminescence material usage, the first layer can further comprise particles of a light scattering material such as for example particles of zinc oxide; silicon dioxide; titanium dioxide; magnesium oxide; barium sulfate; aluminum oxide and combinations thereof. The inventors have discovered that compared with a LED-filament comprising a single-layer structure, a double-layer structure can provide a substantial further reduction, up to 80% by weight reduction, in manganese-activated fluoride red photoluminescence material usage. Compared with known LED-filaments having manganese-activated fluoride red photoluminescence material on both front and back faces a double-layer structure can provide a 90% by weight reduction in manganese-activated fluoride red photoluminescence material usage. By providing the narrow-band red photoluminescence material in a respective layer disposed on the plurality of LED chips this increases the concentration of narrow-band red photoluminescence material in immediate proximity to LED chips and improves the blue absorption efficiency of the narrow-band red photoluminescence material, thereby reducing narrow-band red photoluminescence material usage.

In embodiments, where the first broad-band green to red photoluminescence materials comprises a first broad-band red photoluminescence material, a content ratio of the first broad-band red photoluminescence material with respect to the total of the first narrow-band red photoluminescence material and the first broad-band red photoluminescence material is at least one of: at least 20 wt %; at least 30 wt %; at least 40 wt %; and in a range from about 20 wt % to less than 60 wt %.

The narrow-band red photoluminescence material(s) such as a manganese-activated fluoride red photoluminescence material can have a peak emission wavelength ranging from 630 nm to 633 nm and may comprise at least one of: $K_2SiF_6:Mn^{4+}$ (KSF), $K_2GeF_6:Mn^{4+}$ (KGF), and $K_2TiF_6:Mn^{4+}$ (KTF).

At least one of the first broad-band green to red photoluminescence material and the second broad-band green to red photoluminescence materials can comprise a rare-earth-activated red photoluminescence material. The rare-earth-activated red photoluminescence materials can have a peak emission wavelength ranging from 620 nm to 650 nm and may comprise at least one of a nitride-based phosphor material having a general composition $AAlSiN_3:Eu^{2+}$ where A is at least one of Ca, Sr or Ba; a sulfur-based phosphor material having a general composition $(Ca_{1-x}Sr_x)(Se_{1-y}S_y):Eu^{2+}$ where $0 \leq x \leq 1$ and $0 < y \leq 1$ and a silicate-based phosphor material having a general composition $(Ba_{1-x}Sr_x)_3SiO_5:Eu^{2+}$ where $0 \leq x \leq 1$.

In embodiments, the first broad-band green to red photoluminescence materials comprises a first broad-band green photoluminescence material and the second broad-band green to red photoluminescence materials comprises a second broad-band green photoluminescence material. The first broad-band green photoluminescence material can have a peak emission wavelength ranging from 530 nm to 550 nm while the second broad-band green photoluminescence material can have a peak emission wavelength ranging from 520 nm to 540 nm. The first and/or second broad-band green photoluminescence materials can comprise a cerium-activated garnet phosphor having a general composition $(Lu_{1-x}Y_x)_3(Al_{1-y}Ga_y)_5O_{12}:Ce$ where $0 \leq x \leq 1$ and $0 \leq y \leq 1$.

The partially light-transmissive substrate can comprise a material selected from the group consisting of: alumina, silica, magnesium oxide, sapphire, quartz glass, diamond, silicon oxide and mixtures thereof.

The LED-filament can be operable to generate white light with a correlated color temperature from 2700K to 6500K. The LED-filament can be operable to generate white light with a general color rendering index CRI Ra of at least 80 and optionally at least 90.

According to further embodiments, an LED-filament comprises: a partially light-transmissive substrate; a plurality of blue LED chips mounted on a front face of the substrate; a broad-band green photoluminescence material, a broad-band red photoluminescence material, and a narrow-band manganese-activated fluoride red photoluminescence material covering the plurality of blue LED chips and the front face of the substrate; and wherein a content ratio of the broad-band red photoluminescence material with respect to the total of the narrow-band red photoluminescence material and broad-band red photoluminescence material is at least 20 wt %. In embodiments, a content ratio of the broad-band red photoluminescence material with respect to the total of the narrow-band manganese-activated fluoride red photoluminescence material and broad-band red photoluminescence material is at least one of: at least 30 wt %; and at least 40 wt %.

In embodiments, the LED-filament can comprise a first layer having the narrow-band red photoluminescence material disposed on the plurality of blue LED chips; and a second layer having the broad-band green photoluminescence material disposed on the first layer; and the broad-band red photoluminescence material is in at least one of: the first layer and the second layer.

In further embodiments, LED-filaments can comprise a double-layer structure on the front and back faces of the substrate, a so called "double-sided double-layer" structure. According to embodiments, an LED-filament comprises: a partially light-transmissive substrate; a plurality of blue LED chips mounted on a front face of the substrate; a first photoluminescence layer comprising a first narrow-band manganese-activated fluoride red photoluminescence material disposed on the plurality of blue LED chips; a second photoluminescence layer comprising a first broad-band green to red photoluminescence materials disposed on the first photoluminescence layer; a third photoluminescence layer comprising a second narrow-band manganese-activated fluoride red photoluminescence material disposed on the back face of the substrate; and a fourth photoluminescence layer comprising a second broad-band green to red photoluminescence material disposed on the third photoluminescence layer. In embodiments, the first layer can comprise a uniform thickness layer (film) on at least the principle light emitting face of at least one of the LED chips, that is the LED-filament comprises CSP (Chip Scale Packaged) LEDs containing the narrow-band red photoluminescence material. The first layer can comprise a uniform thickness layer on all light emitting faces of the LED chips in the form of a conformal coating layer. To reduce narrow-band red photoluminescence material usage, at least one of the first photoluminescence layer and the third photoluminescence layer further comprises particles of a light scattering material selected from the group comprising: zinc oxide; silicon dioxide; titanium dioxide; magnesium oxide; barium sulfate; aluminum oxide; and combinations thereof. The inventors have discovered such a double-sided double-layer structure can substantially reduce (as much as 80% by weight for a substrate with a transmittance of 100%) the usage amount of the narrow-band red photoluminescence material compared with known LED-filaments comprising narrow-band and broad-band red photoluminescence materials on front and back faces of the substrate. In such embodiments, the substrate can have a transmittance in a range from 20% to 100%.

According to a further embodiment, an LED-filament comprises: a partially light-transmissive substrate; a plurality of blue LED chips mounted on a front face of the substrate; first broad-band green to red photoluminescence materials and a narrow-band manganese-activated fluoride red photoluminescence material covering the plurality of blue LED chips and the front face of the substrate; and second broad-band green to red photoluminescence materials covering the back face of the substrate, wherein at least 70% of the total blue light generated by the LED chips is on the front face side of the substrate.

According to an aspect of the invention, an LED-filament lamp comprises: a light-transmissive envelope; and at least one LED-filament as described herein.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, in which.

DETAILED DESCRIPTION OF THE INVENTION

Figure 1A:
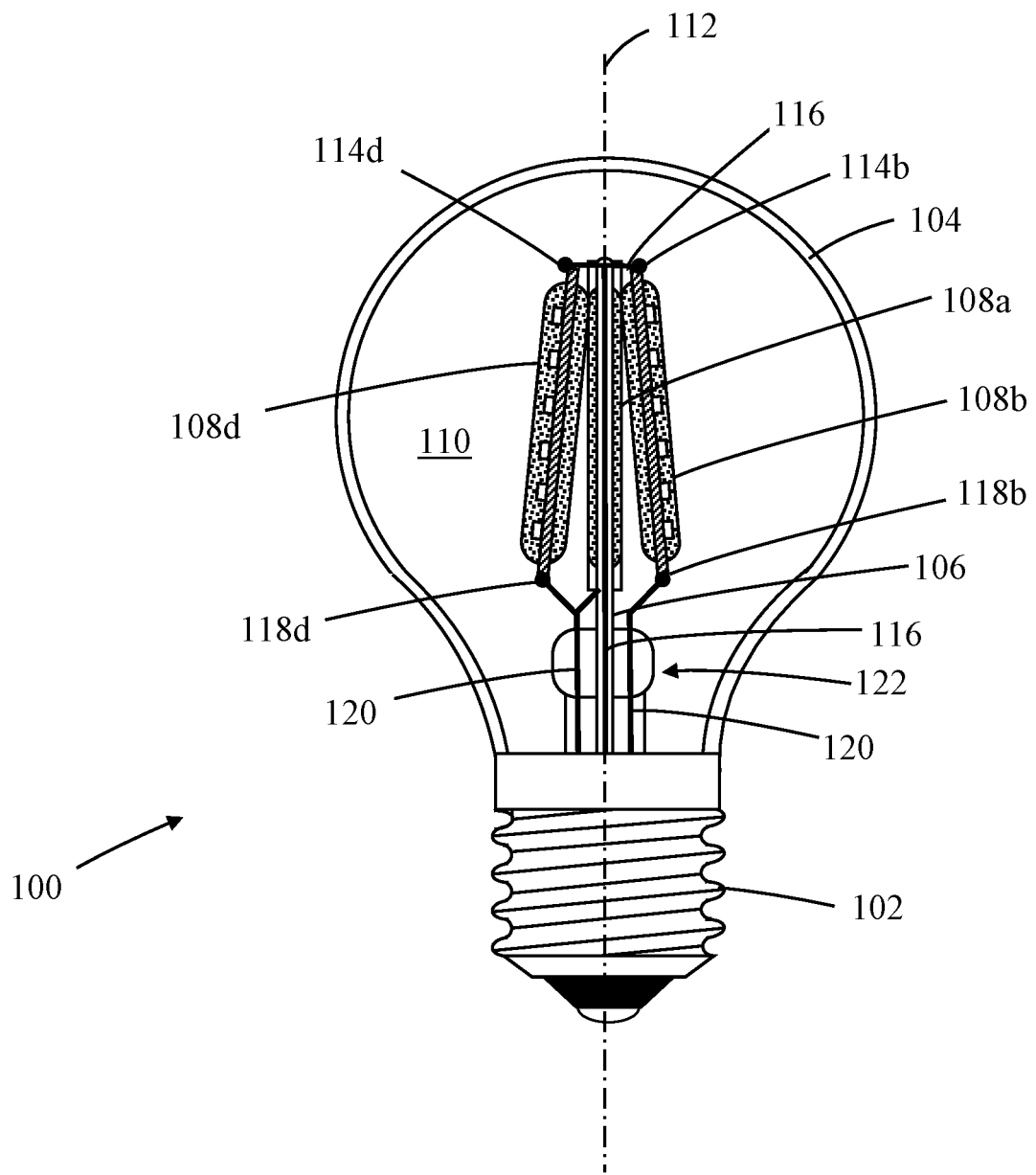
FIGS. 1A and 1B respectively illustrate partial cross-sectional A-A side and plan views of a four LED-filament A-Series (A19) lamp in accordance with an embodiment of the invention.
Figure 1B:
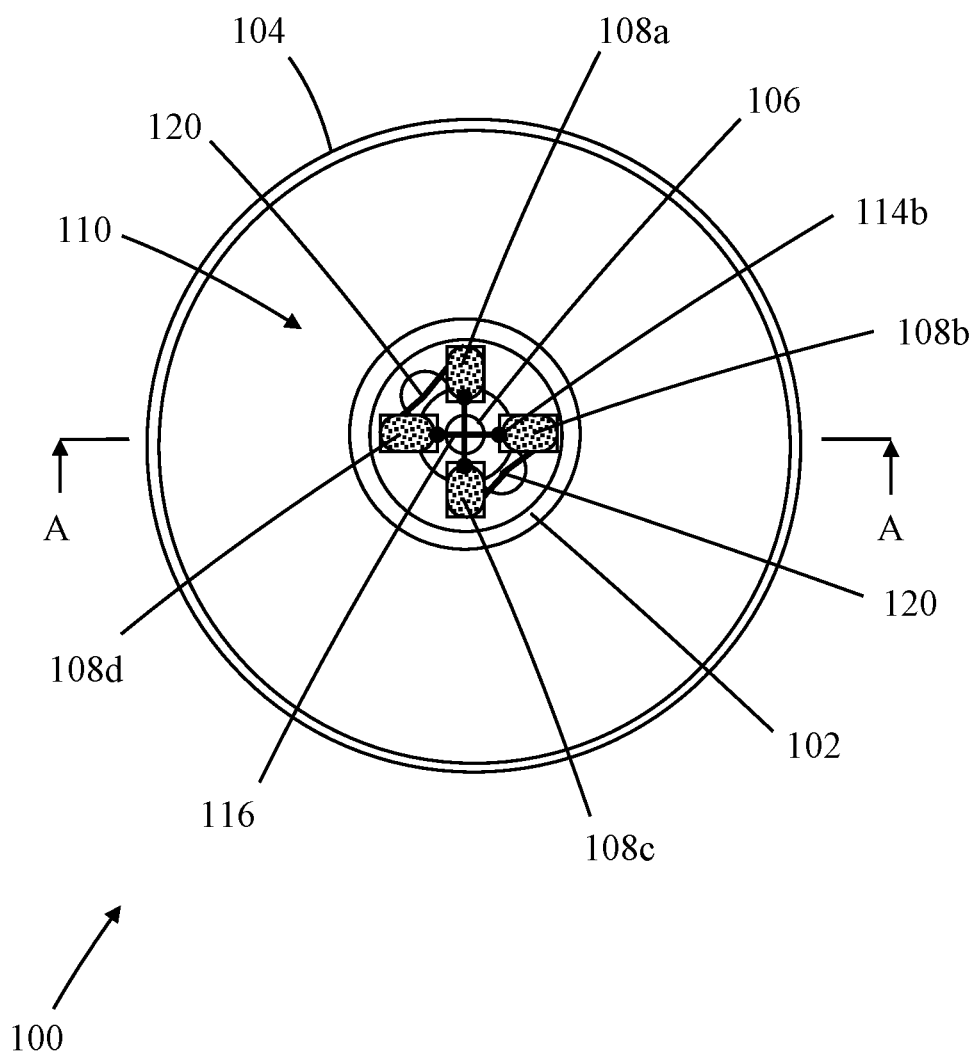

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. FIGS. 1A and 1B respectively illustrate a partial cross-sectional side view through A-A and a partial cutaway plan view of an LED-filament A-Series lamp (bulb) 100 formed in accordance with an embodiment of the invention. The LED-filament lamp (bulb) 100 is intended to be an energy efficient replacement for a traditional incandescent A19 light bulb and can be configured to generate 550 lm of light with a CCT (Correlated Color Temperature) of 2700 K and a general color rendering index CRI Ra of at least 80. The LED-filament lamp is nominally rated at 4 W. As is known, an A-series lamp is the most common lamp type and an A19 lamp is 2⅜ inches (19/8 inches) wide at its widest point and approximately 4⅜ inches in length.

The LED-filament lamp 100 comprises a connector base 102, a light-transmissive envelope 104; an LED-filament support 106 and four LED-filaments 108a, 108b, 108c, 108d.

In some embodiments, the LED-filament lamp 100 can be configured for operation with a 110V (r.m.s.) AC (60 Hz) mains power supply as used in North America. For example and as illustrated, the LED-filament lamp 100 can comprise an E26 (φ26 mm) connector base (Edison screw lamp base) 102 enabling the lamp to be directly connected to a mains power supply using a standard electrical lighting screw socket. It will be appreciated that depending on the intended application other connector bases can be used such as, for example, a double contact bayonet connector (i.e. B22d or BC) as is commonly used in the United Kingdom, Ireland, Australia, New Zealand and various parts of the British Commonwealth or an E27 (φ27 mm) screw base (Edison screw lamp base) as used in Europe. The connector base 102 can house rectifier or other driver circuitry (not shown) for operating the LED-filament lamp.

The light-transmissive envelope 104 is attached to the connector 102. The light-transmissive envelope 104 and LED-filament support 106 can comprise glass. The envelope 104 defines a hermetically sealed volume 110 in which the LED-filaments 108a to 108d are located. The envelope 104 can additionally incorporate or include a layer of a light diffusive (scattering) material such as for example particles of zinc oxide (ZnO), titanium dioxide ($TiO_2$), barium sulfate ($BaSO_4$), magnesium oxide (MgO), silicon dioxide ($SiO_2$) or aluminum oxide ($Al_2O_3$).

The LED-filaments 108a to 108d, which are linear (strip or elongate) in form, are oriented such that their direction of elongation is generally parallel to an axis 112 of the lamp 100. In this embodiment, the LED-filaments 108a to 108d are equally circumferentially spaced around the glass filament support 106 (FIG. 1B), although it will be appreciated that in other embodiments the LED-filaments may not be equally spaced around the glass support. A first electrical contact 114a to 114d on a first end of each LED-filament 108a to 108d distal to the connector base 102 is electrically and mechanically connected to a first conducting wire 116 that passes down an axis of the LED filament support 106 to the connector base 102. A second electrical contact 118a to 118d on a second end of each LED-filament 108a to 108d proximal to the connector base 102 is electrically and mechanically connected to a second conducting wire 120 that passes through a base portion 122 of the LED filament support 106 to the connector base 102. As illustrated, the LED filaments 108a to 108d can be electrically connected in parallel.

An LED-filament according to an embodiment of the invention is now described with reference to FIGS. 2A, 2B and 2C which respectively show a cross-sectional side view through B-B, a partial cut-away plan and a cross-sectional C-C end view of a single-layer LED-filament 208. Throughout this specification, like reference numerals preceded by the figure number are used to denote like parts. The LED-filament 208 comprises a partially light-transmissive substrate 224 having an array of blue emitting (465 nm) unpackaged LED chips (dies) 226 mounted directly to a front (first) face 228. Typically each LED-filament has a total nominal power of about 0.7 to 1 W.

The substrate 224 can further comprise the respective electrical contacts 214, 218 on the front face 228 at the first and second ends of the substrate 224 for electrical connection to a respective one of the conducting wires 116, 120 (FIG. 1A) to provide electrical power to operate the LED-filament. The electrical contacts 214, 218 can comprise copper, silver or other metal or a transparent electrical conductor such as indium tin oxide (ITO). In the embodiment, illustrated the substrate 224 is planar and has an elongate form (strip) with the LED chips 226 being configured as a linear array (string) and equally spaced along the length (direction of elongation) of the substrate. As indicated in FIGS. 2A and 2B the LED chips 226 can be electrically connected in series by bond wires 230 between adjacent the LED chips of the string and wire bonds 232 between the LED chips at the distal ends of the substrate and their respective electrical contact 214, 218.

When the LED-filament 208 is used as a part of an energy efficient bulb an elongate configuration is typically preferred since the appearance and emission characteristics of the device more closely resembles a traditional filament of an incandescent bulb. It should be noted that the LED chips 226 are unpackaged and emit light from both their top and bottom (base) faces with the base surface of the LED chip mounted directly on the substrate 224.

In accordance with the invention, the light-transmissive substrate 224 can comprise any material which is partially light-transmissive and preferably has a transmittance to visible light from 2% to 70% (reflectance of 98% to 30%). The substrate can comprise a glass, ceramic material or a plastics material such as polypropylene, silicone or an acrylic. Typically, in embodiments the light-transmissive substrate comprises a porous ceramic substrate composed of alumina that has a transmittance of about 40%. To aid in the dissipation of heat generated by the LED chips 226, the substrate 224 can not only be light-transmissive, but can also be thermally conductive to aid in the dissipation of heat generated by the LED chips. Examples of suitable light-transmissive thermally conductive materials include: magnesium oxide, sapphire, aluminum oxide, quartz glass, and diamond. The transmittance of the thermally conductive substrate can be increased by making the substrate thin. To increase mechanical strength, the substrate can comprise a laminated structure with the thermally conductive layer mounted on a light-transmissive support such as a glass or plastics material. To further assist in the dissipation of heat, the volume 110 (FIG. 1A) within the glass envelope 104 (FIG. 1A) is preferably filled with a thermally conductive gas such as helium, hydrogen or a mixture thereof.

In accordance with embodiments of the invention, the LED-filament 208 further comprises a first photoluminescence wavelength conversion material 236 applied to and covering the LED chips 226 and front face 228 of the substrate 224 and a second different photoluminescence wavelength conversion material 238 applied to and covering the second back (opposite) face 234 of the substrate 224. The first photoluminescence wavelength conversion material 236 is applied directly to the LEDs chips 226 and covers the front face of the substrate in the form of an encapsulating layer.

In accordance with the invention, the first photoluminescence wavelength conversion material 236 comprises a mixture of a first broad-band green photoluminescence material having a peak emission wavelength ranging from 520 nm to 560 nm (preferably 540 nm to 545 nm), a first broad-band red photoluminescence material having a peak emission wavelength ranging from 620 nm to 650 nm and a narrow-band red photoluminescence material typically a manganese-activated fluoride phosphor. Collectively, the first broad-band green and red photoluminescence materials will be referred to as first broad-band green to red photoluminescence materials. Since in this embodiment both the narrow-band red and broad-band green to red photoluminescence materials are provided as a mixture in a single layer the LED-filament will be referred to as a "single-layer" structured filament.

The second photoluminescence wavelength conversion material 238 comprises a mixture of only a second broad-band green photoluminescence material having a peak emission wavelength ranging from 520 nm to 560 nm (preferably 520 nm to 540 nm) and a second broad-band red (non-manganese-activated fluoride) photoluminescence material having a peak emission wavelength ranging from 620 nm to 650 nm. Collectively, the second broad-band green and red photoluminescence materials will be referred to as second broad-band green to red photoluminescence materials.

In contrast, in known LED-filaments, the same photoluminescence material composition (narrow-band and broad-band red photoluminescence materials) is provided on the front and back faces of the filament. Suitable broad-band green photoluminescence materials, narrow-band red photoluminescence materials and broad-band red photoluminescence materials are discussed below.

Figure 2A:
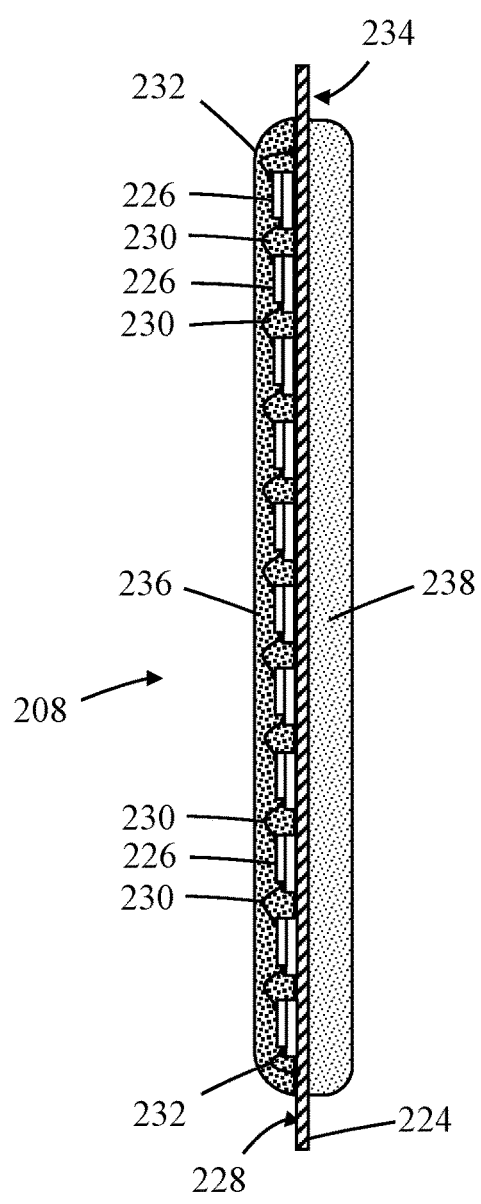
FIGS. 2A, 2B and 2C respectively illustrate schematic cross-sectional B-B side, partial cutaway plan and cross-sectional C-C end views of a single-layer LED-filament in accordance with an embodiment of the invention for use in the lamp of FIGS. 1A and 1B.
Figure 2B:
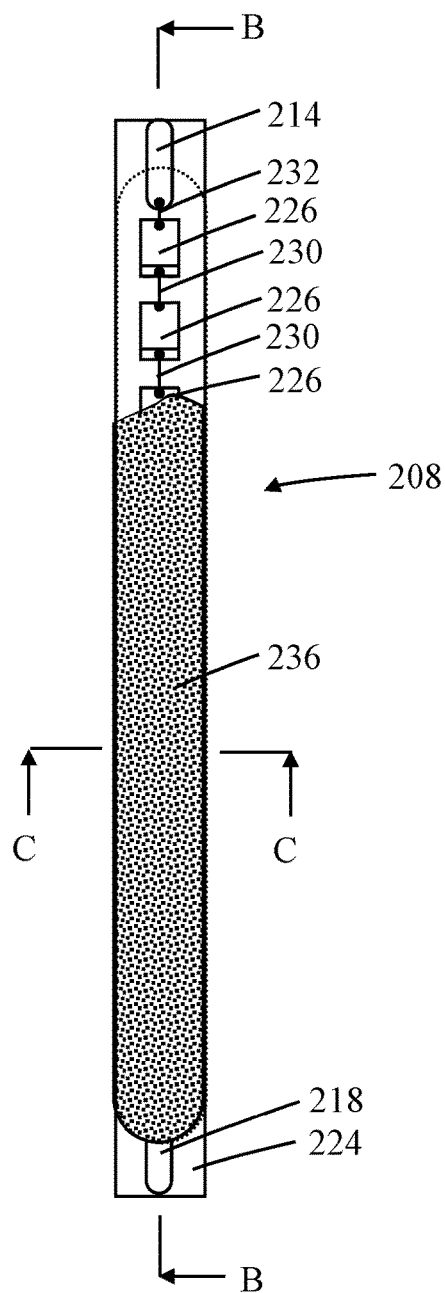

In the embodiment illustrated in FIGS. 2A and 2B, the first and second photoluminescence conversion materials 236 and 238 are constituted as a single layer comprising a mixture of broad-band green and red photoluminescence materials.

In operation, blue excitation light generated by the LED chips 226 excites the green-emitting and red emitting photoluminescence materials to generate green and red light. The emission product of the LED-filament 208 which appears white in color comprises the combined photoluminescence light and unconverted blue LED light. Since the photoluminescence light generation process is isotropic, phosphor light is generated equally in all directions and light emitted in a direction towards the substrate 224 can pass through the substrate and be emitted from the back of the LED-Filament 208. It will be appreciated that the use of a partially light-transmissive substrate 224 enables the LED-filament to achieve an emission characteristic in which light is emitted in a direction away from both the front face 228 and back face 234 of the substrate. Additionally, particles of a light scattering material can be combined with the phosphor material to reduce the quantity of phosphor required to generate a given emission product color.

Figure 3A:
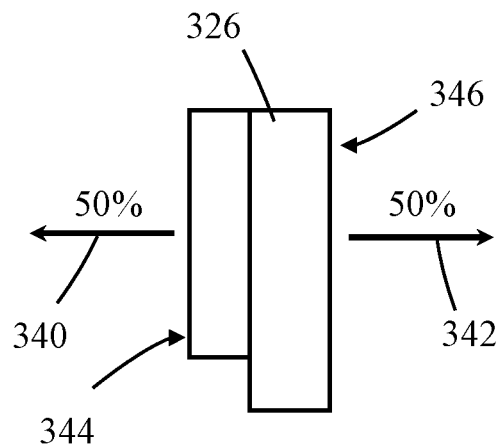
FIGS. 3A and 3B are respectively a schematic representation of an LED chip showing its emission characteristics in forward and backward directions and a schematic exploded representation of an LED chip and substrate indicating the distribution of blue excitation light present at front and back face sides of the substrate.
Figure 3B:
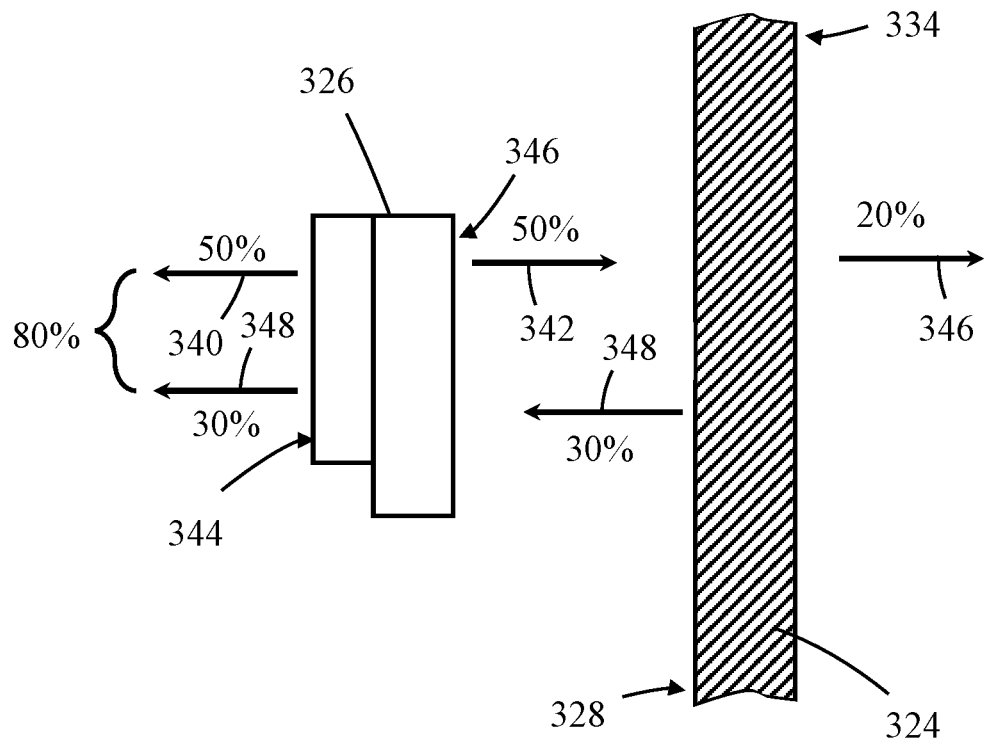

FIG. 3A is a schematic representation of an LED chip 326 showing its emission characteristics in forward/upward 340 and backward/downward 342 directions and FIG. 3B is a schematic exploded representation of the LED chip 326 and a partially light-transmissive substrate 324 indicating the distribution of blue excitation light on opposite face sides 328 and 334 of the substrate 324.

Referring to FIG. 3A and assuming that the blue LED chip 326 emits equal amounts of blue light from its top surface 344 and its base 346, then 50% of the total blue light generated by the LED chip is emitted in a forward direction 340 away from the front face of the substrate and 50% of the total blue light generated by the LED chip is emitted in a backward direction 342 towards the front face of the substrate. Referring to FIG. 3B and assuming that the partially light-transmissive substrate 324 has a transmittance of 40% and a reflectance of 60%, only 40% of the blue light 342 (i.e. 20% of the total blue light generated by the blue LED chip 346) will pass through the substrate 324 and emanate 346 from the back face side 334 of the substrate 324. The remaining 60% of blue light 342 (i.e. 30% of the total blue light generated by the blue LED chip) will be reflected by the substrate 324 in a forward direction and emanate from the front face side 328 of the substrate. It will appreciated that the net effect is that approximately 80% of the total blue light generated by the blue LED chip 326 will be on (emanates from) the front face side of the substrate and only 20% of the total blue light generated by the blue LED chip 326 will be on (emanates from) the back face side of the substrate. Clearly, when the photoluminescence materials are present these figures may change due to scattering of blue light by the photoluminescence materials. As described above, by configuring the proportion of total blue excitation light generated by the blue LED chips present at the front face side of the substrate to be substantially greater (typically at least 70% of the total) than at the opposite back face side this enables use of the higher brightness manganese-activated fluoride phosphor on the front face of the substrate only and a less expensive non manganese-activated fluoride phosphor on the back face of the substrate while still providing substantially most of the increase in brightness benefit but using only half (50% by weight) the quantity of manganese-activated fluoride photoluminescence material. TABLE 1 tabulates the effect of substrate transmittance/reflectance on the proportion of total blue excitation light on (emanates from) the front face and back face sides of the substrate and the relative overall brightness of the LED-filament. The data assumes that each blue LED chip generates equal amounts of blue excitation light in forward and backward directions. The overall relative brightness is relative to a known LED-filament having CASN on the front and back faces of the substrate. For comparison, the relative brightness for an LED-filament having KSF on both faces of the substrate is 120% though it will be appreciated that uses twice the amount of KSF than the LED-filaments of the invention.

TABLE 1

Effect of substrate transmittance/reflectance on the proportion
of blue excitation light on the front and back face sides
of the substrate and LED-filament brightness

| Substrate | | % of total blue excitation light on: | | LED-Filament |
|---|---|---|---|---|
| Transmittance (%) | Reflectance (%) | Front face side of substrate | Back face side of substrate | Brightness (%) |
| 5 | 95 | 97.5 | 2.5 | 124.4 |
| 10 | 90 | 95.0 | 5.0 | 123.8 |
| 20 | 80 | 90.0 | 10.0 | 122.5 |
| 40 | 60 | 80.0 | 20.0 | 120.0 |
| 50 | 50 | 75.0 | 25.0 | 118.8 |
| 60 | 40 | 70.0 | 30.0 | 117.5 |
| 70 | 30 | 65.0 | 35.0 | 116.3 |

Figure 4A:
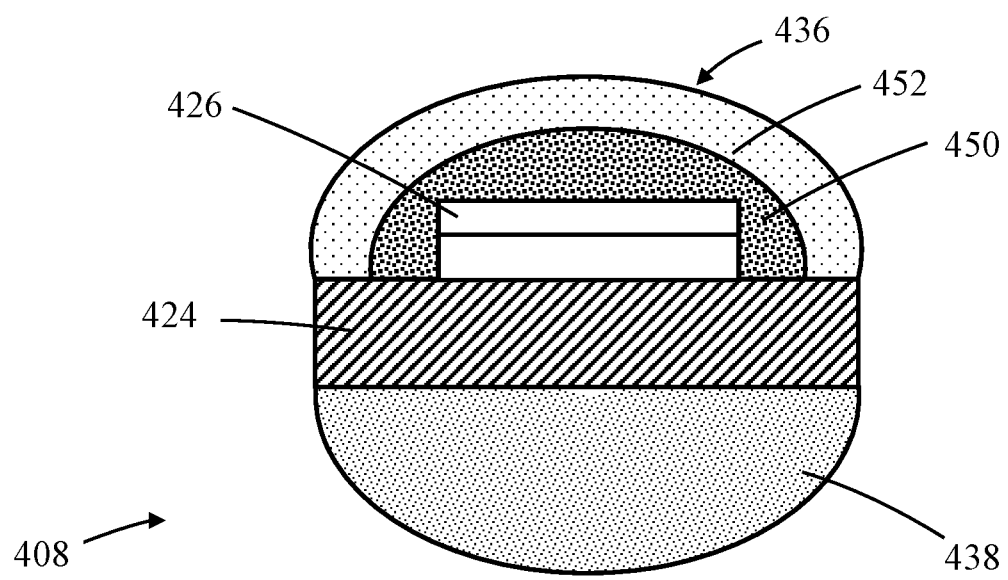
FIGS. 4A and 4B are schematic cross-sectional end views of double-layer LED-filaments in accordance with embodiments of the invention.
Figure 4B:
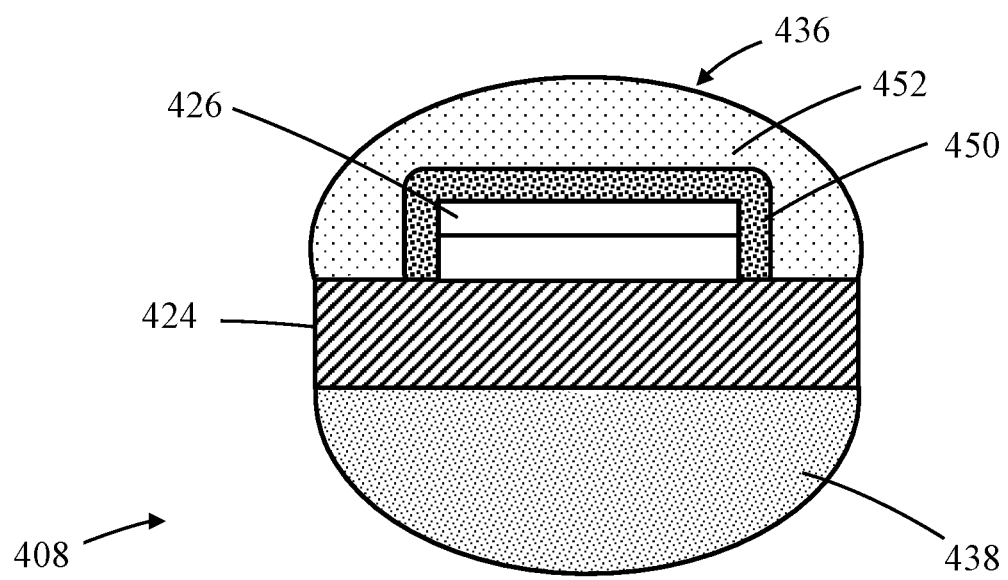

FIGS. 4A and 4B are schematic cross-sectional end views of double-layer LED-filaments 408 in accordance with embodiments of the invention. In these embodiments, the first photoluminescence wavelength conversion material 436 covering the LED chips comprises a "double-layer" structure comprising first and second photoluminescence layers 450 and 452 that respectively contain narrow-band red and first broad-band green to red photoluminescence materials. As illustrated in FIGS. 4A and 4B, the first photoluminescence layer 450, containing the narrow-band red photoluminescence material, is disposed on and covers the LED chips 426 and the second photoluminescence layer 452, containing the first broad-band green to red photoluminescence materials (that is first broad-band green and first broad-band red photoluminescence materials), is disposed on and covers the first photoluminescence layer 450 (that is the first photoluminescence layer 450 is in closer proximity to the LED chips than the second photoluminescence layer).

The double-layer LED-filament of FIG. 4A can be manufactured by firstly depositing the first photoluminescence layer 450 onto the LED chips 426 and then depositing the second photoluminescence layer 452 on the first photoluminescence layer 450. As illustrated the first photoluminescence layer 450 can have a cross section that is generally semi-circular in profile.

In the double-layer LED-filament of FIG. 4B the first photoluminescence layer 450 comprises a uniform thickness coating layer that is applied to the light emitting faces of individual LED chips. LED chips with a uniform thickness layer (film) of phosphor on their light emitting faces are often referred to as CSP (Chip Scale Packaged) LEDs. As illustrated in FIG. 4B the LED chip 426 has a uniform thickness layer applied to the top light emitting and four side light emitting faces and is in the form of a conformal coating. In embodiments (not shown) the LED chip 426 has a uniform thickness first photoluminescence layer 450 applied to the principle (top) light emitting face only. The double-layer LED-filament can be manufactured by first applying the first photoluminescence layer 450 to at least the principle light emitting face of individual LED chips 426, for example using a uniform thickness (typically 20 μm to 300 μm) photoluminescence film comprising the narrow-band red photoluminescence material. The LED chips 426 are then mounted on the substrate 424 and the second photoluminescence layer 452 then deposited to cover the substrate and LED chips. Compared with the double-layer LED-filament of FIG. 4A a uniform thickness coating layer can be preferred as it concentrates all of the narrow-band red photoluminescence material as close to the LED chip as possible and ensures that, regardless of physical location within the layer, all of the narrow-band red photoluminescence material receives exposure to substantially the same excitation light photon density. Such an arrangement can maximize the reduction in narrow-band red photoluminescence material usage.

Figure 2C:
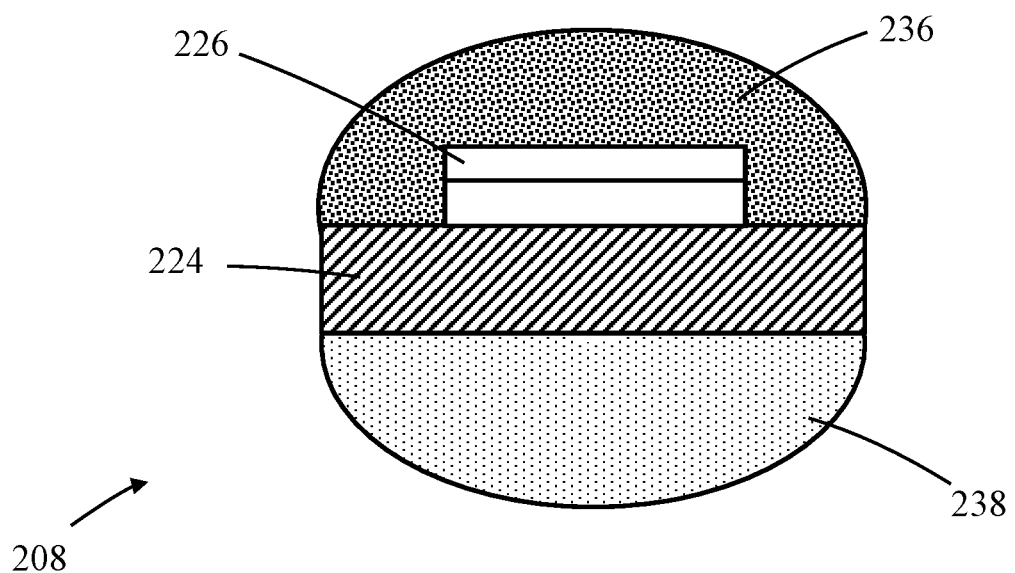

The inventors have discovered that providing the narrow-band red photoluminescence material as a respective individual layer 450 (double-layer structure) is found to further substantially reduce (up to a further 80% by weight reduction) the usage amount of the narrow-band red photoluminescence material compared with an LED-filament in which the narrow-band red and broad-band green photoluminescence materials comprise a mixture in a single layer (FIG. 2C). Moreover, compared with a known LED-filament in which narrow-band red photoluminescence material is provided on both faces of the substrate, a double-layer structured LED-filament reduces the usage amount of narrow-band red photoluminescence material by as much as 90% by weight.

It is believed that the reason for this reduction in usage amount, is that in an LED-filament (FIG. 2C) in which the photoluminescence material 236 comprises a single photoluminescence layer comprising a mixture of a narrow-band red photoluminescence material and broadband green to red photoluminescence materials, the photoluminescence materials have equal exposure to blue excitation light. Since narrow-band red photoluminescence materials, especially manganese-activated fluoride photoluminescence materials, have a much lower blue light absorption capability than the broad-band green photoluminescence materials a greater amount of narrow-band red photoluminescence material is necessary to convert enough blue light to the required red emission. By contrast, in the LED-filaments 408 of FIGS. 4A and 4B, the narrow-band red photoluminescence material in its separate respective layer 450 is exposed to blue excitation light individually; thus, more of the blue excitation light can be absorbed by the narrow-band red photoluminescence material and the remaining blue excitation light can penetrate through to the second photoluminescence layer 452 containing the broad-band green to red photoluminescence materials. Advantageously, in this structure the narrow-band red photoluminescence material can more effectively convert the blue excitation light to red emission without competition from the green to red photoluminescence materials. Therefore, the amount (usage) of a narrow-band red photoluminescence material required to achieve a target color point can be reduced compared with LED-filaments comprising a single-layer comprising a mixture of photoluminescence materials.

Figure 5A:
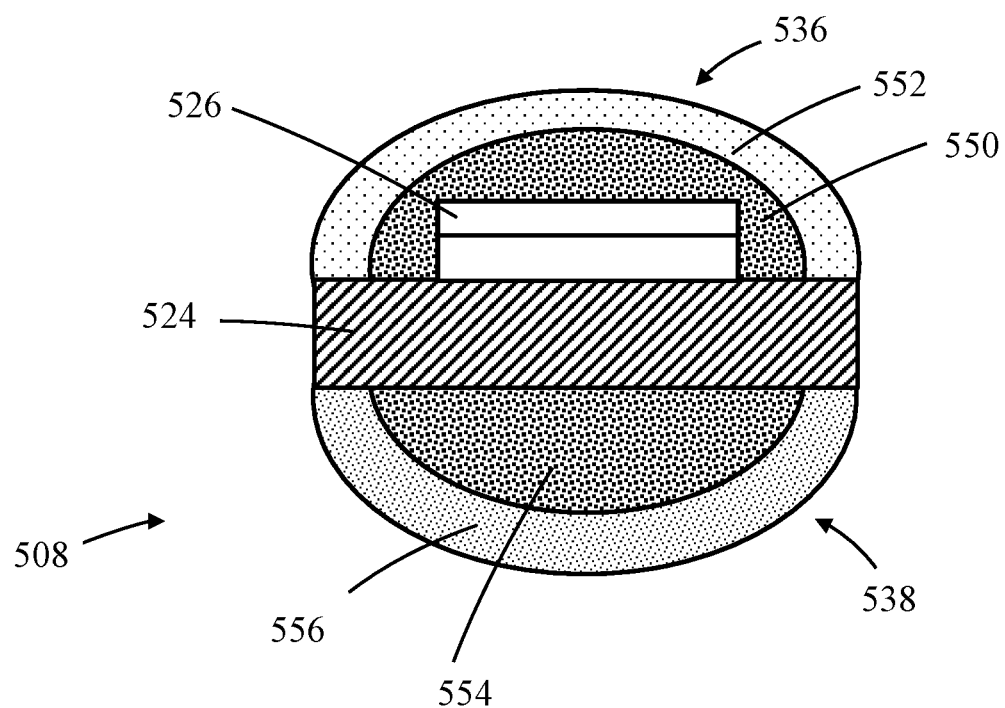
FIGS. 5A and 5B are schematic cross-sectional end views of double-sided double-layer LED-filaments in accordance with embodiments of the invention.
Figure 5B:
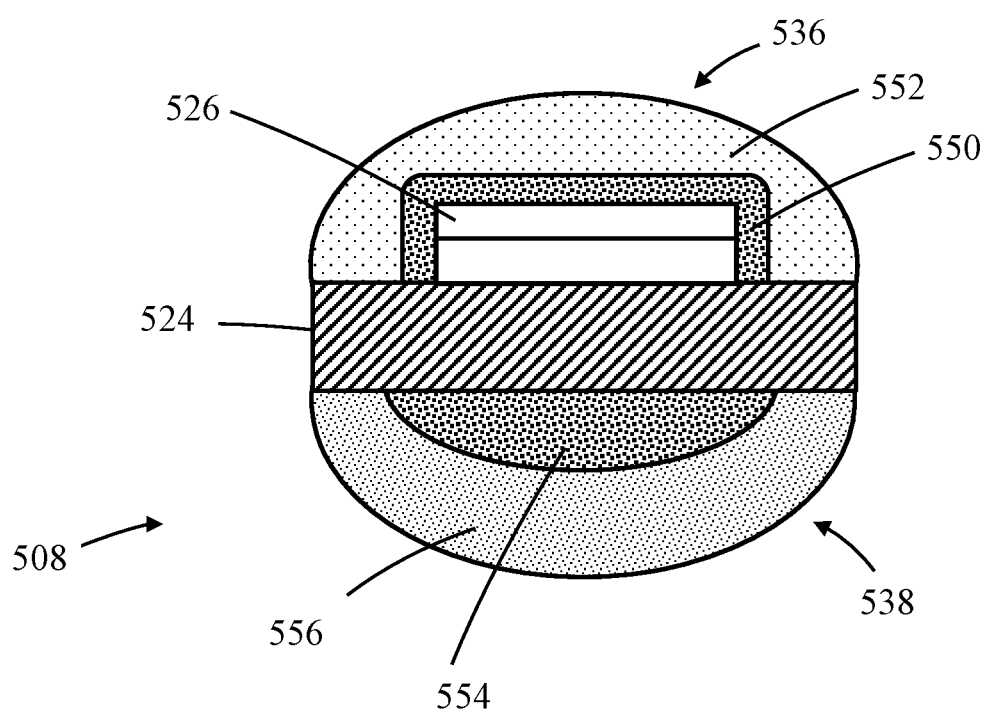

FIGS. 5A and 5B are schematic cross-sectional end views of a double-sided double-layer LED-filaments in accordance with embodiments of the invention. In these embodiments, both the first 536 and second 538 photoluminescence wavelength conversion materials covering the front and back face of the substrate comprise a "double-layer" structure. On the front face of the substrate, the first photoluminescence material 536 covering the LED chips comprises first and second photoluminescence layers 550 and 552 that respectively contain first narrow-band red and first broad-band green to red photoluminescence materials. As illustrated, the first photoluminescence layer 550, containing the first narrow-band red photoluminescence material, is disposed on and covers the LED chips 526 and the second photoluminescence layer 552, containing the first broad-band green to red photoluminescence materials, is disposed on and covers the first photoluminescence layer 550 (that is the first photoluminescence layer 550 is in closer proximity to the LED chips than the second photoluminescence layer). On the back face of the substrate, the second photoluminescence material 538 covering the back face of the substrate 524 comprises third and fourth photoluminescence layers 554 and 556 that respectively contain second narrow-band red and second broad-band green to red photoluminescence materials. As illustrated, the third photoluminescence layer 554, containing the second narrow-band red photoluminescence material, is disposed on and cover a part of the substrate corresponding with the LED chips 526 and the fourth photoluminescence layer 556, containing the second broad-band green to red photoluminescence materials, is disposed on and covers the third photoluminescence layer 554 (that is the third photoluminescence layer 554 is in closer proximity to the back face of the substrate than the fourth photoluminescence layer).

The double-layer double-sided LED-filament of FIG. 5A can be manufactured by firstly depositing the first photoluminescence layer 550 onto the LED chips 526 and then depositing the second photoluminescence layer 552 on the first photoluminescence layer 550. As illustrated the first photoluminescence layer 550 can have a cross section that is generally semi-circular in profile. The third photoluminescence layer 554 is deposited on the back face of the substrate corresponding with the LED chips 526, for example as a strip, and the fourth photoluminescence layer 556 then deposited on and covers the third photoluminescence layer 554. As illustrated the third photoluminescence layer 554 can have a cross section that is generally semi-circular in profile.

In the double-layer double-sided LED-filament of FIG. 5B the first photoluminescence layer 550 comprises a uniform thickness layer applied to at least the principle light emitting face of individual LED chips, that is the LED-filament comprises CSP LEDs. As illustrated in FIG. 5B the LED chip 526 has a uniform thickness layer applied to the top light emitting and four side light emitting faces and is in the form of a conformal coating. In embodiments (not shown) the LED chip 526 has a uniform thickness first photoluminescence layer 550 applied to the principle (top) light emitting face only. The double-layer LED-filament can be manufactured by first applying the first photoluminescence layer 550 to at least the principle light emitting face of individual LED chips 526, for example using a uniform thickness (typically 20 μm to 300 μm) photoluminescence film comprising the narrow-band red photoluminescence material. The LED chips 526 are then mounted on the substrate 524 and the second photoluminescence layer 552 then deposited to cover the substrate and LED chips. The third photoluminescence layer 554 is deposited of the back face of the substrate corresponding with the LED chips 526, for example as a strip, and the fourth photoluminescence layer 556 then deposited on, and covers, the third photoluminescence layer 554.

The inventors have discovered LED-filaments having a double-sided double-layer structure can substantially reduce (as much as 80% by weight reduction for a substrate with a transmittance of 100%) the usage amount of the narrow-band red photoluminescence material compared with known LED-filaments comprising narrow-band and broad-band red photoluminescence materials on front and back faces.

Figure 6:
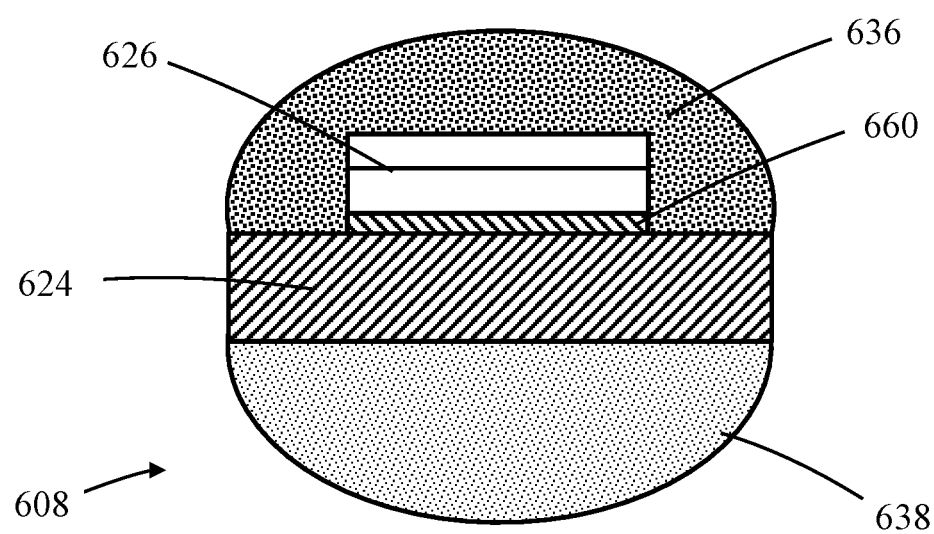
FIG. 6 is a schematic cross-sectional end view of an LED-filament in accordance with an embodiment of the invention.

FIG. 6 is a schematic cross-sectional end view of an LED-filament in accordance with an embodiment of the invention. In this embodiment, one or more of the LED chips 626 has a reflector 660 on its base. The reflector 660 reduces blue light emission from the base of the LED chip and reflect such light in a forward/upward direction. The reflector can be 100% light reflective or partially light reflective. It will be appreciated that the invention contemplates that other embodiments disclosed herein may also include reflector(s) on the base(s) of the LED chips.

In various embodiments of the invention, and to reduce photoluminescence material usage, in particular to further reduce narrow-band red photoluminescence material usage, the LED-filament can further comprise particles of a light scattering material such as for example particles of zinc oxide (ZnO), titanium dioxide ($TiO_2$) barium sulfate ($BaSO_4$), magnesium oxide (MgO), silicon dioxide ($SiO_2$), aluminum oxide ($Al_2O_3$), zirconium dioxide ($ZrO_2$) or mixtures thereof. The particles of light scattering material can be provided as a mixture with any of the photoluminescence materials and/or in a separate layer in contact with a photoluminescence material layer. Preferably, the particles of light scattering material are incorporated with the narrow-band red photoluminescence material to further reduce narrow-band red photoluminescence usage. For example, for a single-layer structured LED-filament the particles of light scattering material can be incorporated in the first photoluminescence wavelength conversion material 236 as part of the mixture of the first broad-band green to red photoluminescence materials and the narrow-band red photoluminescence material (FIG. 2C). For a double-layer structured LED filament, the particles of light scattering material can be incorporated as a mixture with the narrow-band red photoluminescence material in the first photoluminescence layer 450 (FIG. 4). For a double-sided double-layer LED-filament, the particles of light scattering material can be incorporated as a mixture with the narrow-band red photoluminescence material in the first and/or third photoluminescence layers 550, 554 (FIG. 5).

Alternatively and/or in addition, the particles of light scattering material can be provided in a separate layer that is in contact with the layer containing the narrow-band red photoluminescence material to further reduce narrow-band red photoluminescence usage.

The inclusion of particles of a light scattering material with the photoluminescence material increases the number of collisions of LED generated excitation light with particles of the photoluminescence material enhancing photoluminescence light generation which decreases the amount of photoluminescence material usage. It is believed that on average as little as 1 in 10,000 interactions of a photon with a photoluminescence material results in absorption and generation of photoluminescence light. The majority, about 99.99%, of interactions of photons with a photoluminescence material particle result in scattering of the photon. Since the inclusion of the light scattering materials increases the number of collisions this increases the probability of photoluminescence light generation, which decreases the amount of photoluminescence material usage to generate a selected emission intensity.

Broad-Band Green Photoluminescence Materials

In this patent specification, a broad-band green photoluminescence material refers to a material which generates light having a peak emission wavelength ($\lambda_{pe}$) in a range ~520 nm to ~560 nm, that is in the yellow/green to green region of the visible spectrum. Preferably, the green photoluminescence material has a broad emission characteristic and preferably has a FWHM (Full Width Half Maximum) of between about 50 nm and about 120 nm. The green photoluminescence material can comprise any photoluminescence material, such as for example, garnet-based inorganic phosphor materials, silicate phosphor materials and oxynitride phosphor materials. Examples of suitable green phosphors are given in TABLE 2.

In some embodiments, the green photoluminescence materials comprises a cerium-activated yttrium aluminum garnet phosphor of general composition $Y_3(Al_{1-y}Ga_y)_5O_{12}$:Ce (YAG) where 0<y<1 such as for example a YAG series phosphor from Intematix Corporation, Fremont Calif., USA which have a peak emission wavelength of in a range 520 nm to 543 nm and a FWHM of ~120 nm. In this patent specification, the notation YAG# represents the phosphor type—YAG—based phosphors—followed by the peak emission wavelength in nanometers (#). For example, YAG535 denotes a YAG phosphor with a peak emission wavelength of 535 nm. The green photoluminescence material may comprise a cerium-activated yttrium aluminum garnet phosphor of general composition $(Y,Ba)_3(Al,Ga)_5O_{12}$:Ce (YAG) such as for example a GNYAG series phosphor from Intematix Corporation, Fremont Calif., USA. In some embodiments, the green photoluminescence material can comprise an aluminate (LuAG) phosphor of general composition $Lu_3Al_5O_{12}$:Ce (GAL). Examples of such phosphors include for example the GAL series of phosphor from Intematix Corporation, Fremont Calif., USA which have a peak emission wavelength of 516 nm to 560 nm and a FWHM of ~120 nm. In this patent specification, the notation GAL# represents the phosphor type (GAL)—LuAG—based phosphors—followed by the peak emission wavelength in nanometers (#). For example, GAL520 denotes a GAL phosphor with a peak emission wavelength of 520 nm. Suitable green phosphors are given in TABLE 2.

Examples of green silicate phosphors include europium activated ortho-silicate phosphors of general composition $(Ba, Sr)_2SiO_4$:Eu such as for example G, EG, Y and EY series of phosphors from Intematix Corporation, Fremont Calif., USA which have a peak emission wavelength in a range 507 nm to 570 nm and a FWHM of ~70 nm to ~80 nm. Suitable green phosphors are given in TABLE 2.

In some embodiments, the green phosphor can comprise a green-emitting oxynitride phosphor as taught in U.S. Pat. No. 8,679,367 entitled "*Green-Emitting (Oxy) Nitride-Based Phosphors and Light Emitting Devices Using the Same*" which is hereby incorporated in its entirety. Such a green-emitting oxynitride (ON) phosphor can have a general composition $Eu^{2+}:M^{2+}Si_4AlO_xN_{(7-2x/3)}$ where $0.1 \leq x \leq 1.0$ and $M^{2+}$ is one or more divalent metal selected from the group consisting of Mg, Ca, Sr, Ba, and Zn. In this patent specification, the notation ON# represents the phosphor type (oxynitride) followed by the peak emission wavelength ($\lambda_{pe}$) in nanometers (#). For example ON495 denotes a green oxynitride phosphor with a peak emission wavelength of 495 nm.

TABLE 2

Example broad-band green photoluminescence materials

| Phosphor | General Composition | | Wavelength $\lambda_p$ (nm) |
|---|---|---|---|
| YAG (YAG#) | $Y_{3-x}(Al_{1-y}Ga_y)_5O_{12}$:Ce$_x$ | 0.01 < x < 0.2 & 0 < y < 2.5 | 520-550 |
| GNYAG (YAG#) | $(Y,Ba)_{3-x}(Al_{1-y}Ga_y)_5O_{12}$:Ce$_x$ | 0.01 < x < 0.2 & 0 < y < 2.5 | 520-550 |
| LuAG (GAL#) | $Lu_{3-x}(Al_{1-y}M_y)_5O_{12}$:Ce$_x$ | 0.01 < x < 0.2 & 0 < y < 1.5 M = Mg, Ca, Sr, Ba, Ga, | 500-550 |
| LuAG (GAL#) | $Lu_{3-x}(Al_{1-y}Ga_y)_5O_{12}$:Ce$_x$ | 0.01 < x < 0.2 & 0 < y < 1.5 | 500-550 |
| Silicate | $A_2SiO_4$:Eu | A = Mg, Ca, Sr, Ba | 500-550 |
| Silicate | $(Sr_{1-x}Ba_x)_2SiO_4$:Eu | 0.3 < x < 0.9 | 500-550 |
| Oxynitride (ON#) | $Eu^{2+}:M^{2+}Si_4AlO_xN_{(7-2x/3)}$ | $M^{2+}$ = Mg, Ca, Sr, Ba, Zn $0.1 \leq x \leq 1.0$ | 500-550 |

Red Photoluminescence Materials

Narrow-Band Red Photoluminescence Materials

In this patent specification, a narrow-band red photoluminescence material refers to a photoluminescence material which, in response to stimulation by excitation light, generates light having a peak emission wavelength in a range 610 nm to 655 nm; that is light in the red region of the visible spectrum and which has a narrow emission characteristic with a full width at half maximum (FWHM) emission intensity of between about 5 nm and about 50 nm (less than about 50 nm). As described above, the narrow-band red photoluminescence can comprise a manganese-activated fluoride red photoluminescence material that is disposed on and covers the front face of the substrate on which the LED chips are mounted. An example of a narrow-band red manganese-activated fluoride photoluminescence material is manganese-activated potassium hexafluorosilicate phosphor (KSF)—$K_2SiF_6$:Mn$^{4+}$ (KSF). An example of such a KSF phosphor is NR6931 KSF phosphor from Intematix Corporation, Fremont Calif., USA which has a peak emission wavelength of about 632 nm. Other manganese-activated phosphors can include: $K_2GeF_6$:Mn$^{4+}$ (KGF) and $K_2TiF_6$:Mn$^{4+}$ (KTF).

Broad-Band Red Photoluminescence Materials

In this patent specification, a broad-band red photoluminescence material (also referred to as a non-manganese-activated fluoride red photoluminescence material) refers to a photoluminescence material which, in response to stimulation by excitation light, generates light having a peak emission wavelength in a range 600 nm to 640 nm; that is light in the orange to red region of the visible spectrum and which has a broad emission characteristic with a full width at half maximum (FWHM) emission intensity of greater than about 50 nm. As described above, the broad-band red photoluminescence can comprise rare-earth activated red photoluminescence materials. A broad-band red photoluminescence material (non-manganese-activated fluoride red photoluminescence material) denotes a red photoluminescence material whose crystal structure is other than that of a narrow-band red photoluminescence material (manganese-activated fluoride photoluminescence material), such as for example rare-earth-activated red photoluminescence materials and can comprise any such red photoluminescence material that is excitable by blue light and operable to emit light with a peak emission wavelength $\lambda_p$ in a range about 600 nm to about 640 nm. Rare-earth-activated red photoluminescence material can include, for example, a europium activated silicon nitride-based phosphor, α-SiAlON, Group IIA/IIB selenide sulfide-based phosphor or silicate-based phosphors. Examples of red phosphors are given in TABLE 3.

In some embodiments, the europium activated silicon nitride-based phosphor comprises a Calcium Aluminum Silicon Nitride phosphor (CASN) of general formula $CaAlSiN_3:Eu^{2+}$. The CASN phosphor can be doped with other elements such as strontium (Sr), general formula $(Sr,Ca)AlSiN_3:Eu^{2+}$. In this patent specification, the notation CASN# represents the phosphor type (CASN) followed by the peak emission wavelength ($\lambda_{pe}$) in nanometers (#). For example, CASN625 denotes a red CASN phosphor with a peak emission wavelength of 625 nm.

In an embodiment, the rare-earth-activated red phosphor can comprise a red-emitting phosphor as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_aSr_bSi_cAl_dN_eEu_f$, wherein: M is Ca, and 0.1≤a≤0.4; 1.5<b<2.5; 4.0≤c≤5.0; 0.1≤d≤0.15; 7.5<e<8.5; and 0<f<0.1; wherein a+b+f >2+d/v and v is the valence of M.

Alternatively, the rare-earth-activated red phosphor can comprise a red emitting nitride-based phosphor as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/v)}M'_2Si_{5-x}Al_xN_8:RE$, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies 0.1≤x<0.4, and wherein said red-emitting phosphor has the general crystalline structure of $M'_2Si_5N_8:RE$, Al substitutes for Si within said general crystalline structure, and M is located within said general crystalline structure substantially at the interstitial sites. An example of one such a phosphor is XR610 red nitride phosphor from Intematix Corporation, Fremont Calif., USA which has a peak emission wavelength of 610 nm.

Rare-earth-activated red phosphors can also include Group IIA/IIB selenide sulfide-based phosphors. A first example of a Group IIA/IIB selenide sulfide-based phosphor material has a composition $MSe_{1-x}S_x:Eu$, wherein M is at least one of Mg, Ca, Sr, Ba and Zn and 0<x<1.0. A particular example of this phosphor material is CSS phosphor ($CaSe_{1-x}S_x:Eu$). Details of CSS phosphors are provided in co-pending United States patent application Publication Number US2017/0145309 filed 30 Sep. 2016, which is hereby incorporated by reference in its entirety. The CSS red phosphors described in United States patent publication US2017/0145309 can be used in the present invention. The emission peak wavelength of the CSS phosphor can be tuned from 600 nm to 650 nm by altering the S/Se ratio in the composition and exhibits a narrow-band red emission spectrum with FWHM in the range ~48 nm to ~60 nm (longer peak emission wavelength typically has a larger FWHM value). In this patent specification, the notation CSS# represents the phosphor type (CSS) followed by the peak emission wavelength in nanometers (#). For example, CSS615 denotes a CSS phosphor with a peak emission wavelength of 615 nm.

In some embodiments, the rare-earth-activated red phosphor can comprise an orange-emitting silicate-based phosphor as taught in U.S. Pat. No. 7,655,156 entitled "Silicate-Based Orange Phosphors" which is hereby incorporated in its entirety. Such an orange-emitting silicate-based phosphor can have a general composition $(Sr_{1-x}M_x)_yEu_zSiO_5$ where 0<x≤0.5, 2.6≤y≤3.3, 0.001≤z≤0.5 and M is one or more divalent metal selected from the group consisting of Ba, Mg, Ca, and Zn. In this patent specification, the notation O# represents the phosphor type (orange silicate) followed by the peak emission wavelength ($\lambda_{pe}$) in nanometers (#). For example, O600 denotes an orange silicate phosphor with a peak emission wavelength of 600 nm.

TABLE 3

Example broad-band red photoluminescence materials

| Phosphor | General Composition | | Wavelength $\lambda_p$ (nm) |
|---|---|---|---|
| CASN (CASN#) | $(Ca_{1-x}Sr_x)AlSiN_3:Eu$ | 0.5 < x ≤ 1 | 600-650 |
| 258 nitride | $Ba_{2-x}Sr_xSi_5N_8:Eu$ | 0 ≤ x ≤ 2 | 580-650 |
| Group IIA/IIB Selenide Sulfide (CSS#) | $MSe_{1-x}S_x:Eu$ | M = Mg, Ca, Sr, Ba, Zn<br>0 < x < 1.0 | 600-650 |
| CSS (CSS#) | $CaSe_{1-x}S_x:Eu$ | 0 < x < 1.0 | 600-650 |
| Silicate (O#) | $(Sr_{1-x}M_x)_yEu_zSiO_5$ | M = Ba, Mg, Ca, Zn<br>0 < x ≤ 0.5<br>2.6 ≤ y ≤ 3.3<br>0.001 ≤ z ≤ 0.5 | 565-650 |

Nomenclature

In this specification, the following nomenclature is used to denote LED-filaments: Com.# denotes a comparative LED-filament having the same photoluminescence materials on the front and back faces of the substrate and Dev.# denotes an LED-filament (device) in accordance with an embodiment of the invention having a narrow-band red (manganese-activated fluoride) photoluminescence material on the front face of the substrate and a broad-band red photoluminescence material on a back face of the substrate.

Experimental Data—Single-Layer Structure LED-Filament

Comparative LED-filaments (Com.1 and Com.2) and single-layer LED-filament in accordance with the invention (Dev.1) each comprise a 52 mm by 1.5 mm porous silica substrate with a transmittance 40% having twenty four serially connected 1025 (10 mil×25 mil) blue LED chips of dominant wavelength $\lambda_d$=456 nm mounted on a front face. Each LED-filament is a nominal 0.7 W device and is intended to generate white light with a target Correlated Color Temperature (CCT) of 2700K and a target general color rendering index CRI Ra of 90.

The photoluminescence materials (phosphors) used in the test devices are KSF phosphor ($K_2SiF_6:Mn^{4+}$) from Intematix Corporation, CASN phosphor ($Ca_{1-x}Sr_xAlSiN_3$: Eu $\lambda_{pe} \approx 640$ nm), green YAG phosphor (Intematix NYAG4156—$(Y, Ba)_{3-x}(Al_{1-y}Ga_y)_5O_{12}Ce_x$ Peak emission wavelength $\lambda_{pe} = 550$ nm) and green LuAG phosphor (Intematix GAL535—$Lu_{3-x}(Al_{1-y}Ga_y)_5O_{12}:Ce_x \lambda_{pe} \approx 535$ nm).

The red and green phosphors were mixed in a phenyl silicone and the mixture dispensed onto the front and back faces of the substrate.

TABLE 4 tabulates phosphor composition of comparative LED-filaments Com.1 and Com.2 and an LED-filament Dev.1 in accordance with the invention.

As can be seen from TABLE 4, in terms of phosphor composition: comparative LED-filament Com.1 comprises the same phosphor composition on the front and back faces of the substrate and comprises a mixture of 7 wt % CASN640 and 93 wt % GAL535. Comparative LED-filament Com.2 comprises the same phosphor composition on the front and back faces of the substrate and comprises a mixture of 60 wt % KSF and 40 wt % YAG550. LED-filament Dev.1, in accordance with the invention, comprises on the front face of the substrate a mixture of 56 wt % KSF, 4 wt % CASN615 and 40 wt % YAG550 and on a back face of the substrate a mixture of 7 wt % CASN and 93 wt % GAL535.

TABLE 5 tabulates the measured optical performance of the LED-filaments Com.1, Com.2 and Dev.1. As can be seen from TABLE 5, the flux generated by Dev.1 is 22.2 lm greater (19% brighter: Brightness—Br) than LED-filament Com.1 that uses CASN on both front and back faces of the substrate. While LED-filament Com.2 generates a flux that is 33.5 lm greater (26% brighter: Brightness—Br) than LED-filament Com.1, this LED-filament uses double the amount of KSF (narrow-band red photoluminescence material) as that of Dev.1. It will be appreciated that LED-filament Dev.1 achieves 94% (119/126) of the possible brightness gain of using KSF (narrow-band red photoluminescence material) in place of CASN, but using only half (50% by weight) the amount of KSF. This is achieved, at least in part, due to the presence of the partially light transmissive substrate used in Dev.1. The invention thus discloses improvements relating to the LED-filaments and LED-filament lamps and in particular, although not exclusively, reducing the cost of manufacture of LED-filaments without compromising on brightness and CRI Ra.

TABLE 5

Measured optical characteristics of 0.7 W, 2700 K nominal color temperature LED-filaments Com. 1, Com. 2 and Dev. 1

| Filament | Flux (lm) | Br (%) | Light emission (%) Forward | Light emission (%) Backward | CIE x | CIE y | CCT (K) | CRI Ra |
|---|---|---|---|---|---|---|---|---|
| Com. 1 | 115.5 | 100 | 84 | 16 | 0.4245 | 0.3952 | 3070 | 95.6 |
| Com. 2 | 145.8 | 126 | 80 | 20 | 0.4391 | 0.4175 | 3148 | 90.5 |
| Dev. 1 | 137.7 | 119 | 80 | 20 | 0.4821 | 0.4395 | 2624 | 85.0 |

Experimental Data—Double-Layer Structured LED-Filament

As discussed above, double-layer structured LED-filaments (FIGS. 4A and 4B) compared with a single-layer structured LED-filament (FIG. 2C) can provide a substantial reduction in usage amount of narrow-band red photoluminescence material. Dev.2 is a single-layer LED-filament in accordance with the invention Dev.2 and Dev.3 is a double-layer LED-filament (FIG. 4A) in accordance with the invention.

Dev.2 and Dev.3 each comprise a 38 mm by 1.5 mm porous silica substrate with a transmittance $\approx 40\%$ having twenty four serially connected 714 (7 mil×14 mil) blue LED chips of dominant wavelength $\lambda_d = 456$ nm mounted on a front face. Each LED-filament is a nominal 150 lm (1 W) device and is intended to generate white light with a target Correlated Color Temperature (CCT) of 2700K and a target general color rendering index CRI Ra of 90. It will be appreciated that three of these LED-filaments can be used to provide a 450 lm LED-filament lamp.

The photoluminescence materials (phosphors) used in the test devices are KSF phosphor ($K_2SiF_6:Mn^{4+}$) from Intematix Corporation, CASN phosphors ($Ca_{1-x}Sr_xAlSiN_3$: Eu $\lambda$pe 615 nm, 631 nm and 640 nm), and green YAG phosphors (Intematix GYAG4156 and GYAG543—$(Y, Ba)_{3-x}(Al_{1-y}Ga_y)_5O_{12}:Ce_x$ Peak emission wavelength $\lambda_{pe} = 543$ nm and 550 nm).

TABLE 4

Phosphor composition of comparative LED-filaments (Com. 1 and Com. 2) and an LED-filament in accordance with the invention (Dev. 1)

wt % photoluminescence material

| Filament | Front face KSF | Front face CASN615 | Front face CASN640 | Front face YAG550 | Front face GAL535 | Back face KSF | Back face CASN640 | Back face YAG550 | Back face GAL535 |
|---|---|---|---|---|---|---|---|---|---|
| Com. 1 | — | — | 7 | — | 93 | — | 7 | — | 93 |
| Com. 2 | 60 | — | — | 40 | — | 60 | — | 40 | — |
| Dev. 1 | 56 | 4 | — | 40 | — | — | 7 | — | 93 |

For the single-layer LED-filament Dev.2 the red and green phosphors were mixed in a phenyl silicone and the mixture dispensed onto respective front and back faces of the substrate.

For the two-layer LED-filament Dev.3, the KSF was mixed with a phenyl silicone and the mixture dispensed as a strip (first layer) onto the front face of the substrate covering the LED chips. The green phosphor and CASN was mixed in a phenyl silicone and the mixture dispensed as a second layer on the first layer on the front face of the substrate. On the back face, the green phosphor and CASN was mixed in a phenyl silicone and the mixture dispensed onto the back face of the substrate.

TABLE 6 tabulates phosphor compositions of the single-layer LED-filament Dev.2 and the double-layer LED-filament Dev.3. As can be seen from TABLE 6, in terms of phosphor composition the single-layer LED-filament Dev.2 comprises, on the front face of the substrate, a mixture of 74 wt % KSF, 2.2 wt % CASN615 and 23.8 wt % YAG543 and on a back face of the substrate a mixture of 5 wt % CASN (1.4 wt % CASN631+3.6 wt % CASN650) and 95 wt % YAG550. As can be seen from TABLE 6, in terms of phosphor composition the double-layer LED-filament Dev.3 comprises on the front face of the substrate a first layer comprising KSF only (17.0 wt % of the total phosphor content of the front face) and a second layer comprising a mixture of 7.8 wt % CASN615 and 75.2 wt % YAG543 and on a back face of the substrate a mixture of 5 wt % CASN (1.4 wt % CASN631+3.6 wt % CASN650) and 95 wt % YAG550. Dev.3 comprises on the back face of the substrate a mixture of 5 wt % CASN (1.4 wt % CASN631+3.6 wt % CASN650) and 95 wt % YAG550.

TABLE 6

Phosphor composition of a single-layer (Dev. 2) and double-layer (Dev. 3) LED-filaments

| | wt % photoluminescence material | | | | | |
|---|---|---|---|---|---|---|
| | Front face | | | Back face | | |
| | | | | CASN | | |
| Filament | KSF | CASN615 | YAG543 | CASN631 | CASN650 | YAG550 |
| Dev. 2 | 74.0 | 2.2 | 23.8 | 1.4 | 3.6 | 95.0 |
| Dev. 3 | 17.0 | 7.8 | 75.2 | 1.4 | 3.6 | 95.0 |

TABLES 7A and 7B tabulate the phosphor amounts (usage) of the single-layer LED-filament Dev.2 and the double-layer LED-filament Dev.3. The phosphor weight values (weight) in TABLES 7A and 7B are normalized phosphor weight normalized to the weight of KSF of the single-layer LED-filament Dev. 1.

TABLE 7A

Phosphor amount of single-layer (Dev. 2) and double-layer (Dev. 3) LED-filaments weight - phosphor weight normalized to weight of KSF of the single-layer LED-filament Dev. 1

| | Front face - Phosphor amount | | | | | | | | |
|---|---|---|---|---|---|---|---|---|---|
| | KSF | | CASN | | YAG | | Total | | CASN/(CASN + KSF) |
| Filament | weight | % | Weight | % | weight | % | weight | % | (wt %) |
| Dev. 2 | 1.0000 | 100 | 0.0302 | 100 | 0.3219 | 100 | 1.3521 | 100 | 2.9 |
| Dev. 3 | 0.2044 | 20 | 0.0942 | 312 | 0.9070 | 282 | 1.2056 | 89 | 31.5 |

TABLE 7B

Phosphor amount of single-layer (Dev. 2) and double-layer (Dev. 3) LED-filaments weight - phosphor weight normalized to weight of KSF of the single-layer LED-filament Dev. 1

| | Phosphor amount | | | | | | | |
|---|---|---|---|---|---|---|---|---|
| | Back face | | | | | | Total | |
| | CASN | | YAG | | Total | | (Front and Back) | |
| Filament | weight | % | weight | % | weight | % | weight | % |
| Dev. 2 | 0.0524 | 100 | 0.9968 | 100 | 1.0492 | 100 | 2.4013 | 100 |
| Dev. 3 | 0.0963 | 184 | 1.8350 | 184 | 1.9313 | 184 | 3.1369 | 131 |

TABLE 8 tabulates the measured optical performance of the LED-filaments Dev.2 (single-layer) and Dev.3 (double-layer). The data are for a drive current IF=15 mA and drive voltage VF=68.7 V and are after 3 minutes of operation once the filament had reached thermal stability (Hot). As can be seen from TABLE 8, the color point of light generated by the LED-filaments are very similar with the General CRI Ra of the double-layer LED-filament Dev.3 being 93.1 compared with 90.5 of the single-layer LED-filament Dev.2. Moreover, the flux generated by the double-layer LED-filament Dev.3 being 4.7 lm greater (3.0% brighter: Brightness—Br) than the flux generated by the single-layer LED-filament Dev.2. Most significantly, while the two LED-filaments generate very similar light emissions, as can be seen from TABLE 8, compared with the single-layer LED-filament Dev.2, the double-layer LED-filament Dev.3 uses 80% by weight less KSF (0.2044 compared with 1.0000), as can be seen from TABLES 7A and 7B. Although the double-layer LED-filament Dev.3 compared with the single-layer LED-filament Dev.2 uses more CASN (212% by weight increase on front face—0.0942 compared with 0.0302 and 84% by weight increase on back face—0.0963 compared with 0.0524) and YAG (182% by weight increase on front face—0.9070 compared with 0.3219 and 84% by weight increase on back face—1.9313 compared with 1.0492), the double-layer structure still provides a substantial cost saving compared with a single-layer structure due to huge difference in costs of CASN (about a ⅕ of the cost of KSF) and YAG (about 1/100 to 1/150 of the cost of KSF) compared with KSF. It is believed that the reason for the increase in CASN and YAG usage is that due to less blue excitation light reaching the second phosphor layer, more CASN and YAG phosphor is required to generate red and green light to attain the required target color.

As described above, the reduction in KSF usage is a result of locating the KSF in a separate layer that is in contact with (adjacent to) the LED chips. It is believed that the reason for this reduction in KSF usage amount, is that in a single-layer LED-filament Dev.2 comprising a single photoluminescence layer comprising a mixture of KSF (manganese-activated fluoride photoluminescence material), CASN and YAG, the various photoluminescence materials have equal exposure to blue excitation light. Since KSF has a much lower blue light absorption capability than YAG and CASN materials, a greater amount of KSF is necessary to convert enough blue light to the required red emission. By contrast, in the double-layer LED-filament Dev.3, the KSF (manganese-activated fluoride photoluminescence material) in its separate respective first layer is exposed to blue excitation light individually without competition from the YAG and CASN; thus, more of the blue excitation light can be absorbed by the KSF. Since the KSF can more effectively convert the blue excitation light to red emission, the amount (usage) of KSF (narrow-band red photoluminescence material) required to achieve a target color point can be reduced compared with LED-filaments comprising a single-layer comprising a mixture of photoluminescence materials.

As will be further noted from TABLE 7A, the content ratio of the CASN (broad-band red photoluminescence material) with respect to the total of the KSF (narrow-band red photoluminescence material) and CASN in the double-layer LED-filament Dev.3 is greater than about 30 wt %.

TABLE 8

Measured optical characteristics of 150 lm, 2700 K LED-filaments Dev. 2 and Dev. 3

| Filament | Flux (lm) | Br (%) | Lm/W | CIE x | CIE y | CCT (K) | CRI Ra Ra | R8 | R9 |
|---|---|---|---|---|---|---|---|---|---|
| Dev. 2 | 154.5 | 100.0 | 150.0 | 0.4595 | 0.4103 | 2702 | 90.5 | 91.8 | 76.9 |
| Dev. 3 | 159.2 | 103.0 | 154.3 | 0.4591 | 0.4113 | 2716 | 93.1 | 87.3 | 67.3 |

Dev.4 is a further double-layer LED-filament in accordance with the invention and is a nominal 250 lm (1.5 W) device that is intended to generate white light with a target Correlated Color Temperature (CCT) of 2700K and a target general color rendering index CRI Ra of 90. It will be appreciated that four of these LED-filaments can be used to provide a 1000 lm LED-filament lamp using for example the embodiment of FIGS. 1A and 1B. LED-filament Dev.4 comprises a 52 mm by 3.0 mm porous silica substrate with a transmittance 40% having twenty five serially connected 714 (8 mil×27 mil) blue LED chips of dominant wavelength $\lambda_d$=454 nm mounted on a front face.

TABLE 9 tabulates phosphor compositions of the double-layer LED-filament Dev.4. As can be seen from TABLE 9, in terms of phosphor composition the double-layer LED-filament Dev.4 comprises on the front face of the substrate a first layer comprising KSF only (23.1 wt % of the total phosphor content of the front face) and a second layer comprising a mixture of 7.5 wt % CASN615 and 69.4 wt % YAG543. On a back face of the substrate a mixture of 9.1 wt % CASN615 and 90.9 wt % YAG535.

TABLE 9

Phosphor composition of a 250 lm double-layer LED-filament Dev. 4

| | wt % photoluminescence material | | | | |
|---|---|---|---|---|---|
| | Front face | | | Back face | |
| Filament | KSF | CASN615 | YAG543 | CASN615 | YAG535 |
| Dev. 4 | 23.1 | 7.5 | 69.4 | 9.1 | 90.9 |

TABLES 10A and 10B tabulate the phosphor amounts (mg) of the double-layer LED-filament Dev.4. The phosphor weight values (weight) in TABLES 10A and 10B are normalized phosphor weight normalized to the weight of KSF of a single-layer LED-filament using the same photoluminescence materials. As can be seen from TABLE 10A a double-layer structured LED-filament reduces KSF usage nearly 80% by weight (0.1956 compared with 1.0000) compared with a single-layer structured LED-filament and nearly 90% by weight compared with known LED-filaments that comprise KSF on the front and back faces. As will be further noted from TABLE 10A, the content ratio of the CASN (broad-band red photoluminescence material) with respect to the total of the KSF (narrow-band red photoluminescence material) and CASN in the double-layer LED-filament Dev.4 is about 25 wt %.

TABLE 10A

Phosphor amount of 250 lm double-layer LED-filament Dev. 4

| | Front face - Phosphor amount | | | | |
|---|---|---|---|---|---|
| Filament | KSF weight | % | CASN615 weight | YAG543 weight | Total weight | CASN/(CASN + KSF) (wt %) |
| Dev. 4 | 0.1956 | 19.6 | 0.0642 | 0.7012 | 0.9610 | 24.7 |

TABLE 10B

Phosphor amount of a double-layer LED-filament Dev. 4

| | Phosphor amount | | | |
|---|---|---|---|---|
| | Back face | | | |
| Filament | CASN615 weight | YAG535 weight | Total weight | Total weight Front & Back |
| Dev. 4 | 0.0493 | 0.3764 | 0.4257 | 1.3867 |

TABLE 11 tabulates the measured optical performance of the double-layer LED-filament Dev.4. The data includes measurements immediately after switching the filament on (referred to as Instantaneous or COLD measurement) and after the filament has reached thermal stability (referred to as HOT measurement) after a period of about 3 minutes operation. Test data has shown that double-layer structured LED-filament enable production of LED-filaments having a CRI Ra greater than 90 and an optical performance which is greater (5% to 10%) than known LED-filament with a CRI Ra of only 80.

TABLE 11

Measured optical characteristics of a nominal 250 lm, 2700 K double-layer LED-filament Dev. 4

| Test Condition | $I_F$ (mA) | $V_F$ (V) | Flux (lm) | Lm/W | CIE x | CIE y | CCT (K) | CRI Ra Ra | R8 | R9 |
|---|---|---|---|---|---|---|---|---|---|---|
| Cold (C) | 20.0 | 68.6 | 252.0 | 183.8 | 0.4556 | 0.4148 | 2793 | 92.5 | 83.5 | 59.3 |
| Hot (H) | 20.0 | 67.3 | 234.7 | 174.4 | 0.4553 | 0.4094 | 2756 | 93.4 | 83.6 | 61.2 |
| Δ C to H for $I_F$ = 20 mA | 0.0 | −1.3 | 93% | 95% | −0.0004 | −0.0054 | −37 | +0.9 | +0.1 | +1.9 |
| Hot (H) | 22.0 | 67.4 | 254.5 | 171.6 | 0.4552 | 0.4089 | 2753 | 93.4 | 83.5 | 61.1 |
| Hot (H) | 25.0 | 67.6 | 282.9 | 167.3 | 0.4552 | 0.4083 | 2748 | 93.4 | 83.4 | 61.0 |

Embodiments of the invention thus concern improvements relating to the LED-filaments and LED-filament lamps and in particular, although not exclusively, reducing the cost of manufacture of LED-filaments without compromising on brightness and CRI Ra.

What is claimed is:

1. An LED-filament comprising:
a partially light-transmissive substrate having a front face and a back face;
a plurality of blue LED chips mounted on the front face of the substrate, wherein a portion of the light emitted by the blue LED chips travels through the substrate and out of the back face of the substrate;
a first broad-band green photoluminescence material, a first broad-band red photoluminescence material, and a narrow-band manganese-activated fluoride red photoluminescence material covering the plurality of blue LED chips and the front face of the substrate; and
a second broad-band green photoluminescence material and a second broad-band red photoluminescence material covering the back face of the substrate;
wherein there is no narrow-band manganese-activated fluoride red photoluminescence material covering the back face of the substrate.

2. The LED-filament of claim 1, wherein a content ratio of the first broad-band red photoluminescence material with respect to the total of the narrow-band manganese-activated fluoride red photoluminescence material and the first broad-band red photoluminescence material is at least one of: at least 20 wt %; at least 30 wt %; and at least 40 wt %.

3. The LED-filament of claim 1, comprising a first layer having the narrow-band manganese-activated fluoride red photoluminescence material disposed on the plurality of blue LED chips; and a second layer having the first broad-band green photoluminescence material disposed on the first layer; and the first broad-band red photoluminescence material is in at least one of: the first layer and the second layer.

4. The LED-filament of claim 3, wherein the first layer comprises a uniform thickness layer on at least a principle light emitting face of at least one of the LED chips.

5. The LED-filament of claim 3, wherein the first layer comprises particles of a light scattering material.

6. The LED-filament of claim 1, comprising a layer comprising a mixture of the narrow-band manganese-activated fluoride red photoluminescence material, the first broad-band green photoluminescence material, and the first broad-band red photoluminescence material.

7. The LED-filament of claim 6, wherein the layer further comprises particles of a light scattering material.

8. The LED-filament of claim 1, wherein the narrow-band manganese-activated fluoride red photoluminescence material is at least one of: $K_2SiF_6:Mn^{4+}$, $K_2GeF_6:Mn^{4+}$, and $K_2TiF_6:Mn^{4+}$.

9. The LED-filament of claim 1, wherein at least one of the first broad-band red photoluminescence material and the second broad-band red photoluminescence material comprises a rare-earth-activated red photoluminescence material.

10. The LED-filament of claim 9, wherein the rare-earth-activated red photoluminescence material is at least one of: a nitride-based phosphor material having a general composition $AAlSiN_3:Eu^{2+}$ where A is at least one of Ca, Sr or Ba; a sulfur-based phosphor material having a general composition $(Ca_{1-x}Sr_x)(Se_{1-y}S_y):Eu^{2+}$ where $0 \leq x \leq 1$ and $0 < y \leq 1$; and a silicate-based phosphor material having a general composition $(Ba_{1-x}Sr_x)_3SiO_5:Eu^{2+}$ where $0 \leq x \leq 1$.

11. The LED-filament of claim 1, wherein the substrate has a transmittance of at least one of: from 2% to 70%, from 30% to 50%, and from 10% to 30%.

12. The LED-filament of claim 1, wherein the partially light-transmissive substrate comprises a material selected from the group consisting of: alumina, silica, magnesium oxide, sapphire, quartz glass, diamond, silicon oxide.

* * * * *